(12) United States Patent
Chung et al.

(10) Patent No.: US 10,761,123 B2
(45) Date of Patent: Sep. 1, 2020

(54) METHOD AND AN APPARATUS FOR USE IN AN ELECTRIC CIRCUIT

(71) Applicant: City University of Hong Kong, Kowloon (HK)

(72) Inventors: Shu Hung Henry Chung, Mid-Levels (HK); Chun Sing Cheng, Tin Shui Wai (HK); Wing Hong Lau, Shatin (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/345,400

(22) PCT Filed: Oct. 31, 2016

(86) PCT No.: PCT/CN2016/103954
§ 371 (c)(1),
(2) Date: Apr. 26, 2019

(87) PCT Pub. No.: WO2018/076325
PCT Pub. Date: May 3, 2018

(65) Prior Publication Data
US 2019/0271726 A1    Sep. 5, 2019

(51) Int. Cl.
*G01R 27/08* (2006.01)
*G01R 27/02* (2006.01)
*G01R 31/367* (2019.01)

(52) U.S. Cl.
CPC ............ *G01R 27/08* (2013.01); *G01R 27/02* (2013.01); *G01R 31/367* (2019.01)

(58) Field of Classification Search
CPC ..................................................... G01R 27/08
USPC ......................................................... 375/260
See application file for complete search history.

(56) References Cited

U.S. PATENT DOCUMENTS

| | | | |
|---|---|---|---|
| 4,996,494 A * | 2/1991 | Ranon ............... | H03K 3/53 307/106 |
| 6,196,208 B1 * | 3/2001 | Masters ............. | F02D 31/008 123/597 |
| 2008/0042665 A1 * | 2/2008 | Rezvani ............ | G01N 27/4165 324/713 |
| 2015/0103986 A1 * | 4/2015 | Chen ................. | H04B 3/20 379/93.05 |

FOREIGN PATENT DOCUMENTS

CN    103376361    6/2016

* cited by examiner

*Primary Examiner* — Lihong Yu
(74) *Attorney, Agent, or Firm* — Renner Kenner Greive Bobak Taylor & Weber

(57) ABSTRACT

An apparatus and a method for use in an electric circuit. The apparatus includes a sampling module arranged to obtain an approximation of a voltage-current characteristic of at least one electrical circuit component of the electric circuit subjected to an excitation, wherein each of the at least one electrical circuit component is represented by a constant phase element in an equivalent circuit of the electric circuit; and a processing module arranged to estimate a time-domain voltage response and/or a time-domain current response based on the approximation of the voltage-current characteristic under the excitation applied to the electric circuit.

16 Claims, 19 Drawing Sheets

«METHOD AND AN APPARATUS FOR USE IN AN ELECTRIC CIRCUIT»

TECHNICAL FIELD

The present invention relates to a method and an apparatus for use in an electric circuit, although not exclusively, to a method and an apparatus for estimating a time-domain response of constant phase element subjected to an arbitrary excitation.

BACKGROUND

Electronic or electrical devices usually operate with a predetermined electrical characteristic, such as desired current and/or voltage profile. Each of the electrical components in an electrical device may be easily analysed using suitable sensors or sampler, however the characterization of an electric circuit or network with a number of electrical components of different types may be complicated.

Some specific types of electrical components or networks may response in differently in the time-domain and the frequency-domain. Accordingly, time-domain and frequency-domain response analysis may be useful in characterizing or predicting the behaviour of the circuit. The analysis may be useful in earlier stages in designing the electronic or electrical devices.

SUMMARY OF THE INVENTION

In accordance with a first aspect of the present invention, there is provided a method for use in an electric circuit, comprising the steps of: obtaining an approximation of a voltage-current characteristic of at least one electrical circuit component of the electric circuit subjected to an excitation, wherein each of the at least one electrical circuit component is represented by a constant phase element in an equivalent circuit of the electric circuit; and estimating a time-domain voltage response and/or a time-domain current response based on the approximation of the voltage-current characteristic under the excitation applied to the electric circuit.

In an embodiment of the first aspect, the approximation includes a combination of a plurality of discrete-time representations each represents the voltage-current characteristic at a predetermined time period.

In an embodiment of the first aspect, the approximation includes a plurality of voltage response of the at least one electrical circuit component in response to a plurality of current pulses.

In an embodiment of the first aspect, the method further comprises the step of decomposing a continuous current passing through the at least one electrical circuit component to the plurality of current pulses.

In an embodiment of the first aspect, each of the plurality of current pulses are represented by a linear relation.

In an embodiment of the first aspect, the approximation is a zero-order approximation.

In an embodiment of the first aspect, the current pulse includes a square waveform.

In an embodiment of the first aspect, the combination of a plurality of discrete-time representations is expressed as:

$$v_{CPE}(nT) = \frac{T^\phi}{\Gamma[\phi+1]C_o} \sum_{k=0}^{n-1} i_{CPE}[kT][(n-k)^\phi - (n-k-1)^\phi] + V_o,$$

wherein: $\phi \in [0,1]$ represents a dispersion coefficient, $C_o$ represents a capacitance value of the at least one electrical circuit component, $\Gamma$ represents a Gamma function, and T represents the sampling period.

In an embodiment of the first aspect, the approximation is a first-order approximation.

In an embodiment of the first aspect, the current pulse includes a trapezoidal waveform.

In an embodiment of the first aspect, the current pulse includes an initial current value and a final current value different from the initial current value.

In an embodiment of the first aspect, the combination of the plurality of discrete-time representations is expressed as:

$$v_{CPE}(nT) = \frac{T^\phi}{C_o} \sum_{k=0}^{n-1} \Big\{ \frac{1}{\Gamma[\phi+1]} [i_{CPE}[kT](n-k)^\phi - i_{CPE}[k+1T](n-k-1)^\phi] + \frac{i_{CPE}[k+1T] - i_{CPE}[kT]}{\Gamma[\phi+2]} [(n-k)^{\phi+1} - (n-k-1)^{\phi+1}] \Big\} + V_o,$$

wherein: $\phi \in [0,1]$ represents a dispersion coefficient, $C_o$ represents a capacitance value of the at least one electrical circuit component, $\Gamma$ represents a Gamma function, and T represents the sampling period.

In an embodiment of the first aspect, each of the at least one electrical circuit component exhibits double-layer characteristics.

In an embodiment of the first aspect, each of the at least one electrical circuit component includes a battery or a supercapacitor.

In accordance with a second aspect of the present invention, there is provided an apparatus for use in an electric circuit, comprising a sampling module arranged to obtain an approximation of a voltage-current characteristic of at least one electrical circuit component of the electric circuit subjected to an excitation, wherein each of the at least one electrical circuit component is represented by a constant phase element in an equivalent circuit of the electric circuit; and a processing module arranged to estimate a time-domain voltage response and/or a time-domain current response based on the approximation of the voltage-current characteristic under the excitation applied to the electric circuit.

In an embodiment of the second aspect, the approximation includes a combination of a plurality of discrete-time representations each represents the voltage-current characteristic at a predetermined time period.

In an embodiment of the second aspect, the approximation includes a plurality of voltage response of the at least one electrical circuit component in response to a plurality of current pulses.

In an embodiment of the second aspect, the sampling module is further arranged to sample a continuous current passing through the at least one electrical circuit component and to decompose the continuous current to the plurality of current pulses.

In an embodiment of the second aspect, each of the plurality of current pulses are represented by a linear relation.

In an embodiment of the second aspect, the approximation is a zero-order approximation.

In an embodiment of the second aspect, the current pulse includes a square waveform.

In an embodiment of the second aspect, the combination of a plurality of discrete-time representations is expressed as:

$$v_{CPE}(nT) = \frac{T^\phi}{\Gamma[\phi+1]C_o} \sum_{k=0}^{n-1} i_{CPE}[kT][(n-k)^\phi - (n-k-1)^\phi] + V_o,$$

wherein: $\phi \in [0,1]$ represents a dispersion coefficient, $C_o$ represents a capacitance value of the at least one electrical circuit component, $\Gamma$ represents a Gamma function, and T represents the sampling period.

In an embodiment of the second aspect, the approximation is a first-order approximation.

In an embodiment of the second aspect, the current pulse includes a trapezoidal waveform.

In an embodiment of the second aspect, the current pulse includes an initial current value and a final current value different from the initial current value.

In an embodiment of the second aspect, the combination of the plurality of discrete-time representations is expressed as:

$$v_{CPE}(nT) = \frac{T^\phi}{C_o} \sum_{k=0}^{n-1} \Big\{ \frac{1}{\Gamma[\phi+1]} [i_{CPE}[kT](n-k)^\phi - i_{CPE}[k+1T](n-k-1)^\phi] + \frac{i_{CPE}[k+1T] - i_{CPE}[kT]}{\Gamma[\phi+2]} [(n-k)^{\phi+1} - (n-k-1)^{\phi+1}] \Big\} + V_o,$$

wherein: $\phi \in [0,1]$ represents a dispersion coefficient, $C_o$ represents a capacitance value of the at least one electrical circuit component, $\Gamma$ represents a Gamma function, and T represents the sampling period.

In an embodiment of the second aspect, each of the at least one electrical circuit component exhibits double-layer characteristics.

In an embodiment of the second aspect, each of the at least one electrical circuit component includes a battery or a supercapacitor.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that a constant phase element (CPE) is an electrical circuit component that may be used to model the electrical characteristics of a double layer as appeared in devices, such as lithium batteries and supercapacitors.

A double layer or an electrical double-layer may exist on the interface between an electrode and its surrounding electrolyte. It is formed as ions from the solution adsorbing onto the electrode surface. The charged electrode is separated from the charged ions by an insulating space. Charges separated by an insulator form a capacitor so a bare metal immersed in an electrolyte will behave like a capacitor.

Figure 1A:
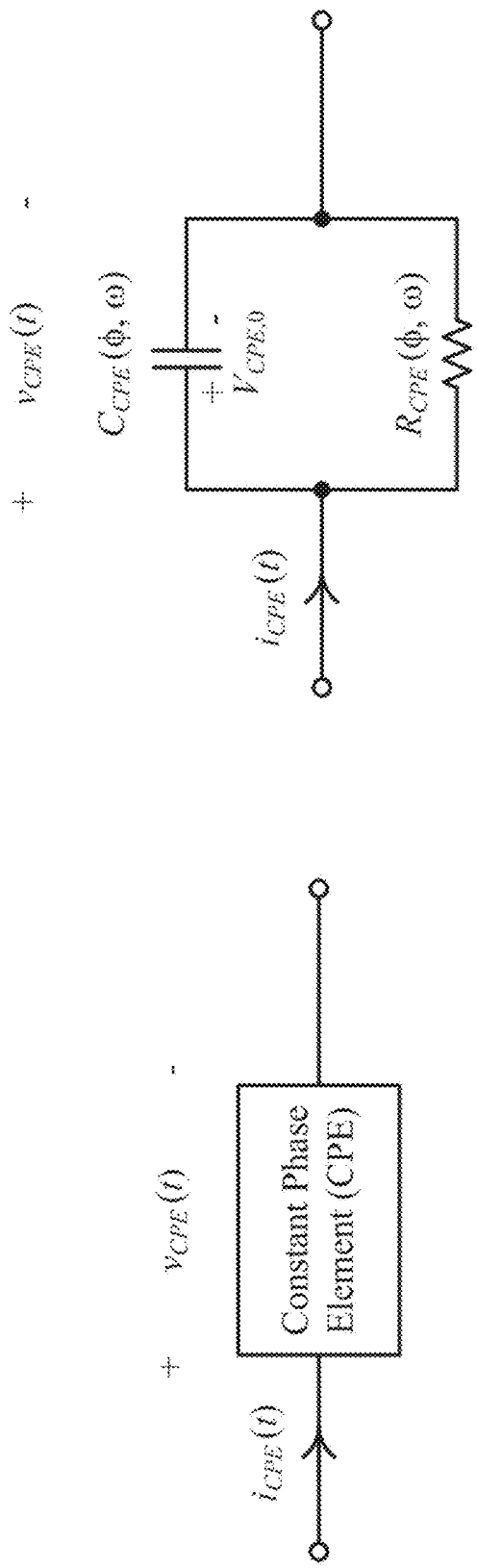
FIGS. 1A to 1C are schematic diagrams of example equivalent circuits and modeling of a constant phase element (CPE)

With reference to FIG. 1A, the impedance of the constant phase element (CPE) $Z_{CPE}$ may be expressed as $$Z_{CPE}(s) = \frac{1}{s^\phi C_o} \tag{1}$$

where $s = j\omega = j(2\pi f)$, f is the operating frequency, $\phi \in [0,1]$ is defined as the dispersion coefficient and $C_o$ is defined as the capacitance of double layer capacitor.

Then, the admittance of $Z_{CPE}$, $Y_{CPE}$, may be expressed as $$Y_{CPE}(s) = s^\phi C_o \tag{2}$$

By substituting $s = j\omega$ into (2), $$Y_{CPE}(\omega) = \omega^\phi C_o \cos\frac{\pi}{2}\phi + j\omega^\phi C_o \sin\frac{\pi}{2}\phi \tag{3}$$

Figure 1B:
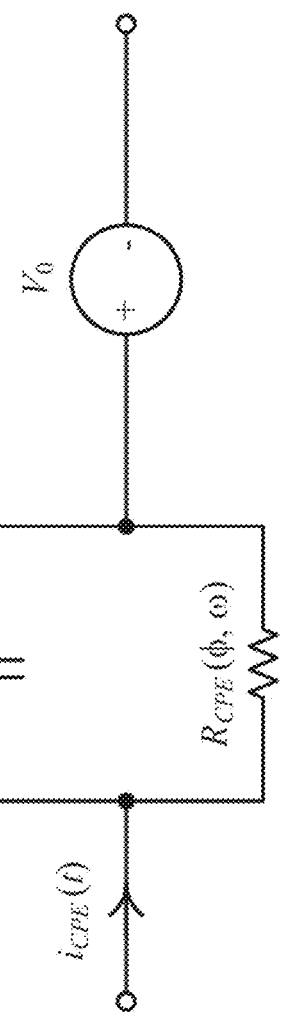

Equation (3) can be represented by a parallel RC network, referring to FIG. 1B, with resistor $R_{CPE}$ and capacitor $C_{CPE}$ equal to $$R_{CPE}(\phi, \omega) = \frac{1}{\omega^\phi C_o \cos\frac{\pi}{2}\phi} \tag{4}$$

$$C_{CPE}(\phi, \omega) = \omega^{\phi-1} C_o \sin\frac{\pi}{2}\phi \tag{5}$$

$R_{CPE}$ and $C_{CPE}$ are dependent on the value of $\phi$ and the operating frequency $\omega$. Some electrical properties are described as follows. The CPE behaves like a pure resistor for $\phi=0$ and a pure capacitor for $\phi=1$. The CPE is equivalent to an open circuit for $\omega=0$. Mathematically, $$R_{CPE}(0, \omega) = \frac{1}{C_o} \quad (6)$$

$$C_{CPE}(1, \omega) = C_o \quad (7)$$

$$R_{CPE}(\phi, \omega) = \infty \quad (8)$$

$$C_{CPE}(\phi, 0) = 0 \quad (9)$$

For $\phi>0$, $C_{CPE}$ is nonzero. The initial voltage on $C_{CPE}$ is the same as the initial voltage $V_{CPE,0}$ across the CPE. As it is a DC value, according to (8), $R_{CPE}$ is infinite, for all $\phi$. With reference FIG. 1C, the CPE is modelled by a parallel $R_{CPE}$-$C_{CPE}$ network in series with a voltage source $V_o = V_{CPE,0}$. For $\phi=0$, $C_{CPE}$ is zero, it is unnecessary to consider the initial voltage, as the equivalent circuit of the CPE is a pure resistor. Thus, $V_o=0$.

In some examples, CPE may be considered as an imperfect capacitor. In order to describe the electrical characteristics, it is typically described by measuring its impedance at a particular operating frequency. That is, the CPE is driven by a pure sinusoidal voltage or current of predefined magnitude and frequency. Then, the impedance of the CPE is calculated by $$Z_{CPE}(\omega_o) = \frac{V_{CPE}}{I_{CPE}} \angle \theta \Big|_{\omega = \omega_o} \quad (10)$$

where $V_{CPE}$ and $I_{CPE}$ are the magnitudes of $v_{CPE}$ and $i_{CPE}$, respectively, and $\theta$ is the phase difference between $v_{CPE}$ and $C_{CPE}$ at the frequency of interest $\omega_o$.

Based on the impedance characteristics over a range of frequencies, the values of $\phi$ and $C_o$ in (1) may be calculated. In some example embodiments, complex systems might contain several CPEs. For example, lithium battery may be described by an equivalent electrical circuit with two, four, or six CPEs, depending on the required level of accuracy. Without loss of generality, the values of $\phi$ and $C_o$ of all CPEs in the equivalent circuit are calculated by studying the impedance characteristics with electrochemical impedance spectroscopy Preferably, with the values of $\phi$ and $C_o$, the time-domain voltage-current characteristics of the CPE operating at a frequency may be estimated. If the voltage or current excitation contains multiple frequencies, the time-domain waveforms can be obtained by firstly decomposing the excitation into multiple frequency components, then determining the response of the CPE at the respective operating frequency, and finally combining all response. Such method allows estimating the response of the CPE to arbitrary excitation, it may have some limitations described as follows.

The frequency spectra of the excitation are practically not known a priori. For example, the discharging current of the batteries on an electric vehicle is determined by many uncertain factors, such as driving behaviour of the drivers. Hence, it is necessary to use sophisticated technique, such as Fourier Transform, to calculate the frequency spectra of the excitation.

The transient response, such as start-up process and large-signal disturbances, cannot be modelled or described by a spectrum of limited bandwidth. Thus, the computation burden could be large.

Figure 2:
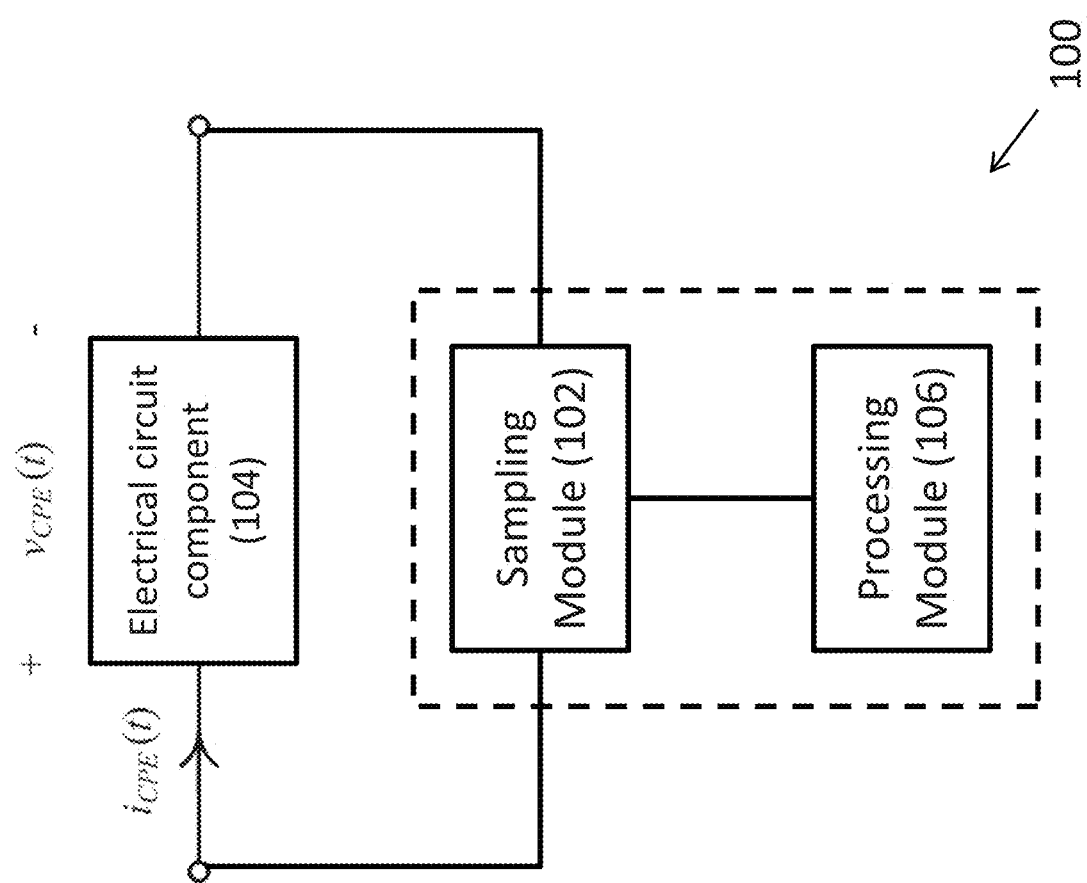
FIG. 2 is a schematic diagram of an apparatus for use in an electric circuit in accordance with an embodiment of the present invention.

With reference to FIG. 2, there is shown an embodiment of an apparatus 100 for use in an electric circuit, comprising a sampling module 102 arranged to obtain an approximation of a voltage-current characteristic of at least one electrical circuit component 104 of the electric circuit subjected to an excitation, wherein each of the at least one electrical circuit component 104 is represented by a constant phase element 104 in an equivalent circuit of the electric circuit; and a processing module 106 arranged to estimate a time-domain voltage response and/or a time-domain current response based on the approximation of the voltage-current characteristic under the excitation applied to the electric circuit.

In this embodiment, the sampling module 102 is arranged to obtain electrical characteristics of one or more electrical circuit component 104, for example by measuring the voltage and the current value across each of electrical circuit components 104 of the electrical circuit when the electrical circuit are supplied with an electrical current or voltage excitation. Alternatively, the sampling module 102 may be implemented to obtain the voltage and current values across the electrical circuit components 104 in a simulated electrical circuit.

As discussed earlier in this disclosure, a CPE may be used to model the electrical characteristics of electrical circuit component which exhibits double layer characteristics in electrical circuits. In some complex systems, multiple CPEs may be used to model the electrical circuit component or a combination of electrical circuit component in an equivalent circuit if such circuit component or a combination of circuit components exhibits double-layer characteristics. Preferably, the equivalent circuit model with multiple CPEs components may be more accurate.

In yet an alternative embodiment, the abovementioned electrical circuit component may include one or more CPE in an equivalent circuit of the electric circuit.

Preferably, the electrical circuit component 104 may be a battery and/or a supercapacitor as discussed in the previous examples. As appreciated by a person skilled in the art, a battery and/or a supercapacitor exhibit double-layer characteristics in an electric circuit, and may sometimes be referred as an "electric double-layer". Similarly, the battery/supercapacitor may be represented by one or more CPE in the equivalent circuit with reference to FIG. 1A.

The processing module 106 is arranged to estimate a time-domain voltage and/or current response based on the approximation of the voltage-current characteristic, for example by processing each of a plurality of a pulse responses of the electrical circuit components 104 of the circuit in the time-domain, such that the time-domain response of the electrical circuit may be obtained by combining the analysis of the responses of the individual components in time-domain. Accordingly, the approximation may include a combination of a plurality of discrete-time representations each may represent the voltage-current characteristic at a predetermined time period.

Preferably, the approximation may include a plurality of voltage responses of the at least one electrical circuit component 104 in response to a plurality of current pulses. The plurality of current pulses may be obtained by decomposing a continuous current passing through the at least one electrical circuit component 104. Alternatively, the plurality of the current pulses and the corresponding voltage response may be individually recorded or obtained.

Figure 3B:
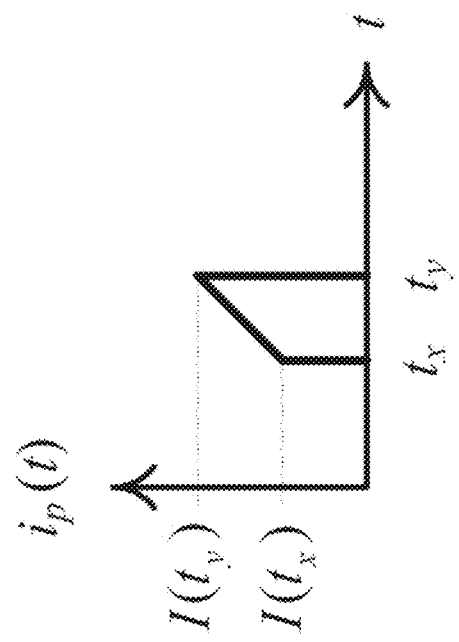
FIGS. 3A and 3B are plots showing examples of single current pulses with a square waveform and a trapezoidal waveform respectively.
Figure 3A:
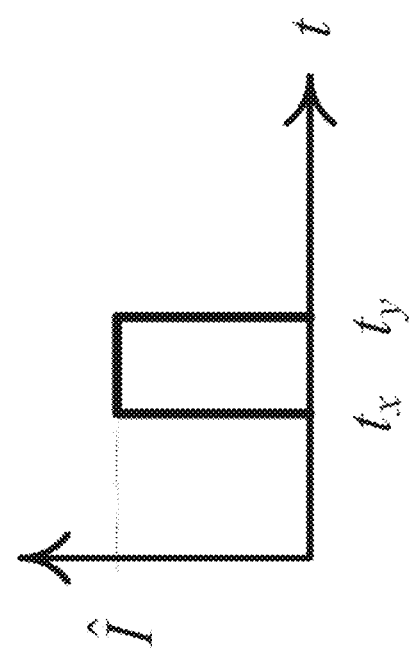

Preferably, the approximation may be a zero-order approximation and/or a first-order approximation. With reference to FIGS. 3A and 3B, each current pulse may include a square waveform or a trapezoidal waveform, and both waveforms may be represented by a linear relation.

With reference to FIG. 3A, the CPE may be subjected to a single square current pulse. The magnitude and duration of the pulse are $\hat{I}$ and $\tau$, respectively. The start and end times of the pulse are $t_x$ and $t_y$, respectively. Thus, $$t_y = t_x + \tau \quad (11)$$

The current pulse $i_p$ can be expressed as $$i_p(t) = \hat{I}\{u[t-t_x] - u[t-t_y]\} \quad (12)$$

where u is the heaviside step function.

The Laplace-Transformed equation of $i_p$ is $$I_p(s) = \frac{\hat{I}}{s}(e^{-st_x} - e^{-st_y}) \quad (13)$$

Figure 1C:
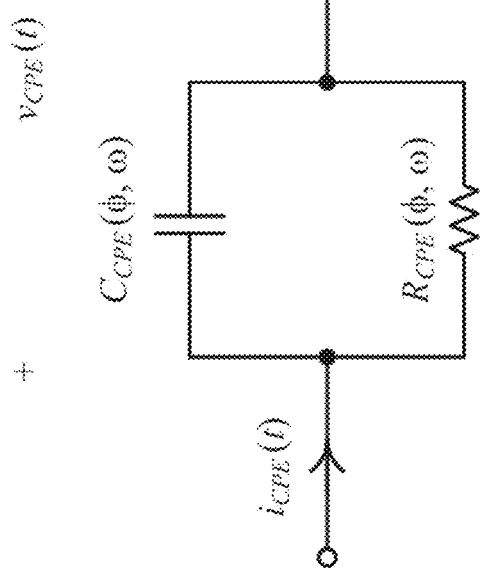

Thus, based on FIG. 1C, the voltage across the CPE, $V_{CPE}(s)$, may be expressed as $$V_{CPE}(s) = Z_{CPE}(s)I_p(s) + \frac{V_o}{s} \quad (14)$$

$$= \frac{\hat{I}}{s^{\phi+1}C_o}(e^{-st_x} - e^{-st_y}) + \frac{V_o}{s}$$

where $$V_o = \begin{cases} V_{CPE,0} & \text{for } \phi > 0 \\ 0 & \text{for } \phi = 0 \end{cases}.$$

The inverse Laplace-Transformed equation of (14) is $$v_{CPE}(t) = \frac{\hat{I}}{\Gamma[\phi+1]C_o}[u[t-t_x](t-t_x)^\phi - u[t-t_y](t-t_y)^\phi] + V_o, \quad (15)$$

for $t > t_x$ where $\Gamma$ is the Gamma function.

Equation (15) may be rewritten into a discrete-time form as $$v_{CPE}(nT) = \quad (16)$$

$$\frac{\hat{I}}{\Gamma[\phi+1]C_o}[u[nT-t_x](nT-t_x)^\phi - u[nT-t_y](nT-t_y)^\phi] + V_o,$$

for $nT \geq t_x$ where T is the sampling period.

Equation (16) gives the voltage profile of CPE after the CPE is subject to a single square current pulse. As the CPE current $i_{CPE}$ is continuous, it is then decomposed into a series of square pulses at the sampling time instant kT as $$i_{CPE}(t) \approx \sum_{k=0}^{n-1} i_{CPE}[kT]\{u[t-kT] - u[t-(k+1)T]\} \quad (17)$$

for $0 < t \leq nT$ where $i_{CPE}[kT]$ is sampled value of $i_{CPE}$ at t=kT.

Thus, by using (16), the voltage across the CPE can be expressed as the sum of the voltage profiles caused by the series of the current pulses in (17). Thus, the combination of the plurality of discrete-time representations may be expressed as:

$$v_{CPE}(nT) = \frac{T^\phi}{\Gamma[\phi+1]C_o}\sum_{k=0}^{n-1} i_{CPE}[kT][(n-k)^\phi - (n-k-1)^\phi] + V_o \quad (18)$$

wherein:

$\phi \in [0,1]$ represents a dispersion coefficient,
$C_o$ represents a capacitance value of the CPE,
$\Gamma$ represents a Gamma function, and
T represents the sampling period.

Alternatively, referring to FIG. 3B, the current pulse may include wave shape which is trapezoidal, i.e. the current pulse includes an initial current value and a final current value different from the initial current value. The time-domain function between the start and end times of the current pulse is described approximately by a linear equation.

If the current pulse is modeled by a linear function for $t \in [t_x, t_y]$, $i_p$ can be expressed as $$i_p(t) = \left\{I(t_x) + \frac{I(t_y) - I(t_x)}{\tau}(t-t_x)\right\}u[t-t_x] - \quad (19)$$

$$\left\{I(t_y) + \frac{I(t_y) - I(t_x)}{\tau}(t-t_y)\right\}u[t-t_y]$$

where $\tau = t_y - t_x$.

The Laplace-Transformed equation of $i_p$ is $$I_p(s) = \left[\frac{I(t_x)}{s} + \frac{I(t_y) - I(t_x)}{s^2\tau}\right]e^{-st_x} - \left[\frac{I(t_y)}{s} + \frac{I(t_y) - I(t_x)}{s^2\tau}\right]e^{-st_y} \quad (20)$$

Thus, the voltage across the CPE, $V_{CPE}(s)$, is $$V_{CPE}(s) = Z_{CPE}(s)I_p(s) + \frac{V_o}{s} \quad (21)$$

$$= \frac{1}{s^\phi C_o}\left[\begin{array}{l}\left\{\frac{I(t_x)}{s} + \frac{I(t_y)-I(t_x)}{s^2\tau}\right\}e^{-st_x} - \\ \left\{\frac{I(t_y)}{s} + \frac{I(t_y)-I(t_x)}{s^2\tau}\right\}e^{-st_y}\end{array}\right] + \frac{V_o}{s}$$

$$= \frac{1}{C_o}\left[\begin{array}{l}\left\{\frac{I(t_x)}{s^{\phi+1}} + \frac{I(t_y)-I(t_x)}{s^{\phi+2}\tau}\right\}e^{-st_x} - \\ \left\{\frac{I(t_y)}{s^{\phi+1}} + \frac{I(t_y)-I(t_x)}{s^{\phi+2}\tau}\right\}e^{-st_y}\end{array}\right] + \frac{V_o}{s}$$

$$= \frac{1}{C_o}\left[\begin{array}{l}\frac{1}{s^{\phi+1}}\{I(t_x)e^{-st_x} - I(t_y)e^{-st_y}\} + \\ \frac{I(t_y)-I(t_x)}{s^{\phi+2}\tau}\{e^{-st_x} - e^{-st_y}\}\end{array}\right] + \frac{V_o}{s}$$

where $V_o = \begin{cases} V_{CPE,0} & \text{for } \phi > 0 \\ 0 & \text{for } \phi = 0 \end{cases}.$ The Inverse Laplace-Transformed equation of $V_{CPE}(s)$ is $$v_{CPE}(t) = \frac{1}{C_o}\left[\frac{1}{\Gamma[\phi+1]}\{I(t_x)(t-t_x)^\phi u[t-t_x] - I(t_y)(t-t_y)^\phi u[t-t_y]\} + \quad (22)$$

-continued $$\frac{I(t_y) - I(t_x)}{\Gamma[\phi+2]\tau}\{(t-t_x)^{\phi+1}u[t-t_x] - (t-t_y)^{\phi+1}u[t-t_y]\} +$$

$$V_o, \text{ for } t > \tau_1$$

where Γ is the Gamma function, $$v_{CPE}(nT) = \quad (23)$$

$$\frac{1}{C_o}\left[\frac{1}{\Gamma[\phi+1]}\{I(t_x)(nT-t_x)^\phi u[nT-t_x] - I(t_y)(nT-t_y)^\phi u[nT-t_y]\} +\right.$$

$$\frac{I(t_y) - I(t_x)}{\Gamma[\phi+2]\tau}\{(nT-t_x)^{\phi+1}u[nT-t_x] -$$

$$\left.(nT-t_y)^{\phi+1}u[nT-t_y]\}\right] + V_o, \text{ for } nT > \tau_1$$

where T is the sampling period.

Equation (23) gives the voltage profile of CPE after the CPE is subject to a single trapezoidal pulse. As the CPE current $C_{CPE}$ is continuous, it is then decomposed into a series of trapezoidal pulses at the sampling time instant kT as $$i_{CPE}(t) \approx \sum_{k=0}^{n-1}\left[i_{CPE}[kT]u[t-kT] -\right. \quad (24)$$

$$i_{CPE}[k+1T]u[t-(k+1)T] + \frac{i_{CPE}[k+1T] - i_{CPE}[kT]}{\tau}$$

$$\left.\{(t-kT)u[t-kT] - (t-(k+1)T)u[t-(k+1)T]\}\right]$$

for $0 < t \leq nT$

Thus, by using (23), the voltage across the CPE can be expressed as the sum of the voltage profiles caused by the series of the current pulses in (24). Thus, $$v_{CPE}(nT) = \quad (25)$$

$$\frac{T^\phi}{C_o}\sum_{k=0}^{n-1}\left\{\frac{1}{\Gamma[\phi+1]}[i_{CPE}[kT](n-k)^\phi - i_{CPE}[k+1T](n-k-1)^\phi] +\right.$$

$$\left.\frac{i_{CPE}[k+1T] - i_{CPE}[kT]}{\Gamma[\phi+2]}[(n-k)^{\phi+1} - (n-k-1)^{\phi+1}]\right\} + V_o$$

wherein:
$\phi \in [0,1]$ represents a dispersion coefficient,
$C_o$ represents a capacitance value of the CPE,
Γ represents a Gamma function, and
T represents the sampling period.

Preferably, equations (18) and (25) may use different current pulse models to characterize the voltage across a CPE under an arbitrary current through it. These embodiments may be used to characterize the circuit behaviors and/or operations of more complex circuits, such as a CPE with a parallel resistor and a Cole-Cole impedance network.

Figure 4:
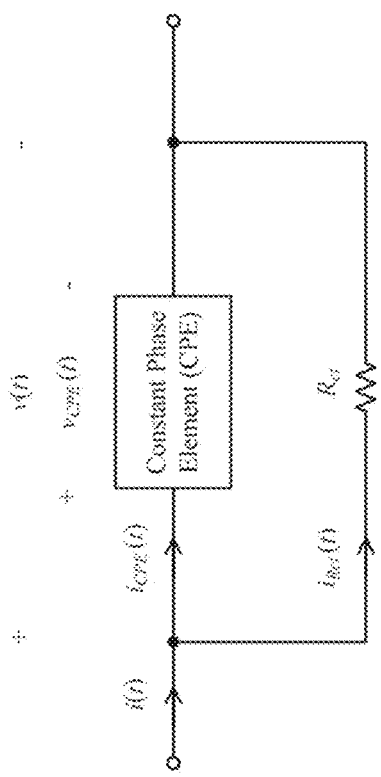
FIG. 4 is a schematic diagram of an example circuit including a CPE with a parallel resistor.

With reference to FIG. 4, there is shown a circuit with a CPE in parallel with a resistor $R_{ct}$, which may be considered as a basic unit for describing the electrical properties of double layer capacitance in devices, such as supercapacitors and lithium batteries.

By using Kirchhoff's voltage and current laws, the voltage across the circuit, v(t) and current through the circuit i(t) are $$v(t) = v_{CPE}(t) \quad (26)$$

$$i(t) = i_{CPE}(t) + i_{Rct}(t) \quad (27)$$

$$= i_{CPE}(t) + \frac{v(t)}{R_{ct}}$$

Based on (27), $$i_{CPE}(t) = i(t) - \frac{v(t)}{R_{ct}} \quad (28)$$

By using (26), (28), and (18), v(nT) can be expressed as $$v(nT) = \frac{T^\phi}{\Gamma[\phi+1]C_o}\sum_{k=0}^{n-1}\left\{i[kT] - \frac{v[kT]}{R_{ct}}\right\}[(n-k)^\phi - (n-k-1)^\phi] - V_o \quad (29)$$

Equation (29) gives the voltage-current characteristics of the module in FIG. 4 with the sampled current modeled by square pulses shown in FIG. 3A.

By using (26), (28), and (25), v(nT) can be expressed as $$v(nT) = \frac{T^\phi}{C_o}\sum_{k=0}^{n-1}\left\{\frac{1}{\Gamma[\phi+1]}\left[\left\{i[kT] - \frac{v_{CPE}[kT]}{R_{ct}}\right\}(n-k)^\phi -\right.\right. \quad (30)$$

$$\left\{i[k+1T] - \frac{v_{CPE}[kT]}{R_{ct}}\right\}(n-k-1)^\phi\right] +$$

$$\left.\frac{i[k+1T] - i[kT]}{\Gamma[\phi+2]}[(n-k)^{\phi+1} - (n-k-1)^{\phi+1}]\right\} + V_o$$

Equation (30) gives the voltage-current characteristics of the module in FIG. 4 with the sampled current modeled by trapezoidal pulses shown in FIG. 3B.

Figure 5:
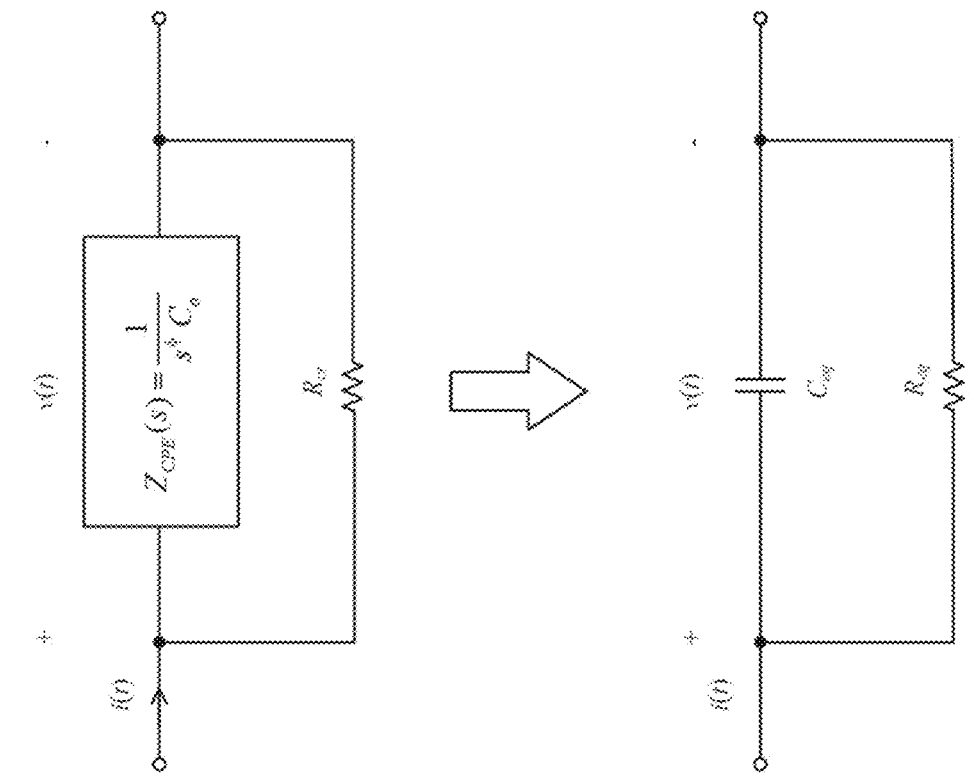
FIG. 5 is a schematic diagram of an equivalent resistor-capacitor model of the example circuit of FIG. 4.

The voltage-current characteristics given in (29) and (30) are evaluated and compared with the resistor-capacitor ($R_{eq}$–$C_{eq}$) model shown in FIG. 5, in which the values of the resistor $R_{eq}$ and capacitor $C_{eq}$ are frequency dependent. The CPE has $\phi=0.7538$ and $C_o=53.54$ [Eq. (1)]. Assume that the initial voltage $V_o$ is zero. The testing frequencies include 10 mHz, 100 Hz, and 1 MHz. The input current is sinusoidal with magnitude of 1 A. Table I shows the equivalent values of resistor $R_{eq}$ and capacitor $C_{eq}$ at the considered frequencies.

TABLE I

Values of $R_{eq}$ and $C_{eq}$ at different frequencies

| Frequency | $R_{CPE}$ | $C_{CPE}$ | $R_{ct}$ | $R_{eq}$ | $C_{eq}$ |
|---|---|---|---|---|---|
| 10 mHz | 0.3988 | 98.0046 | 0.3403 | 0.1836 | 98.0046 |
| 100 Hz | 3.8506e−4 | 10.1495 | 0.3403 | 3.8462e−4 | 10.1495 |
| 1 MHz | 3.7181e−4 | 1.0511 | 0.3403 | 3.7181e−7 | 1.0511 |

Figure 6A:
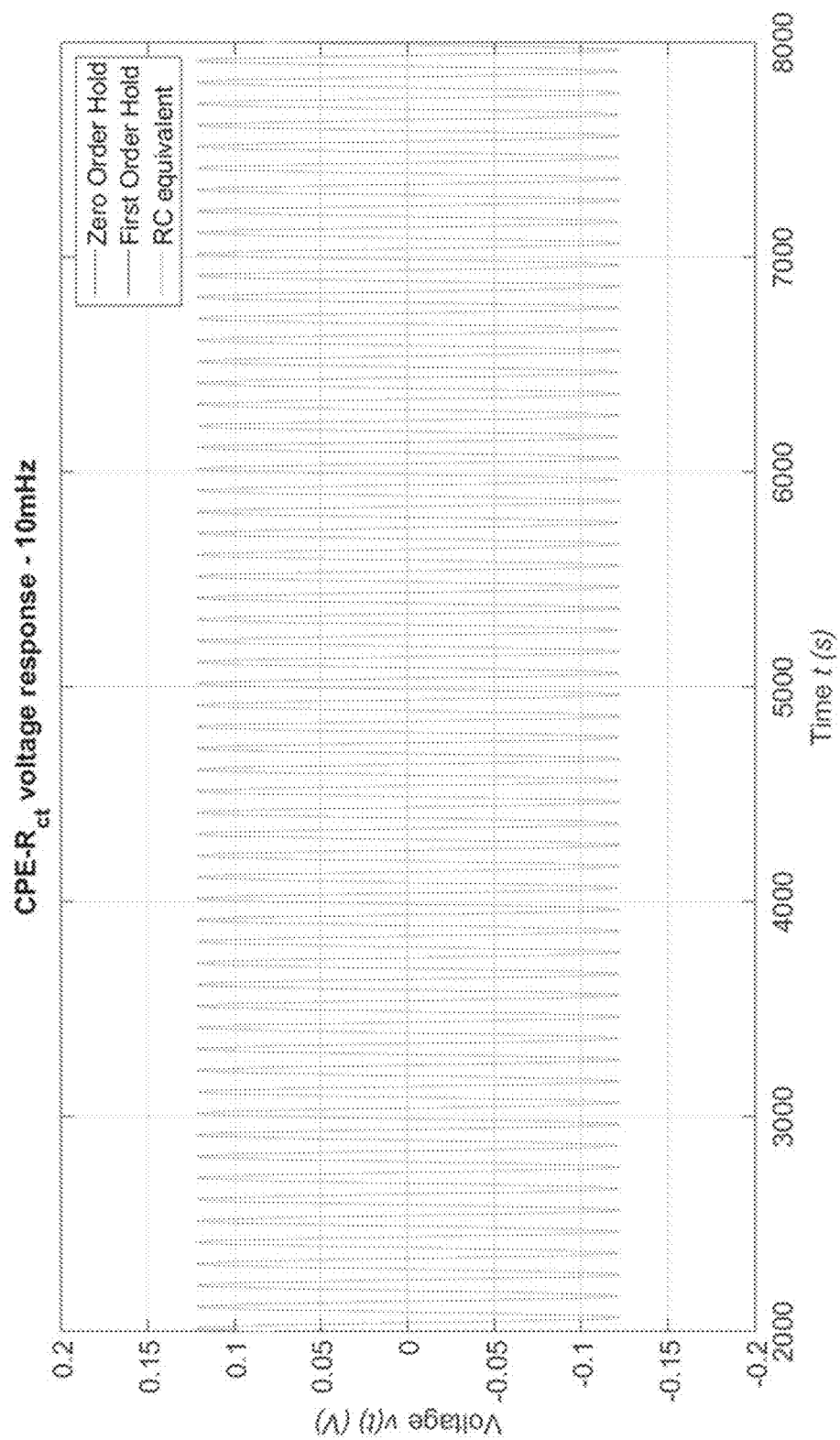
FIGS. 6A to 6C are plots showing time domain simulation results of using zero-order, first-order and RC equivalent approximation of the example circuit of FIG. 4 under excitation frequency of 10 mHz, 100 Hz and 1 MHz respectively.
Figure 6B:
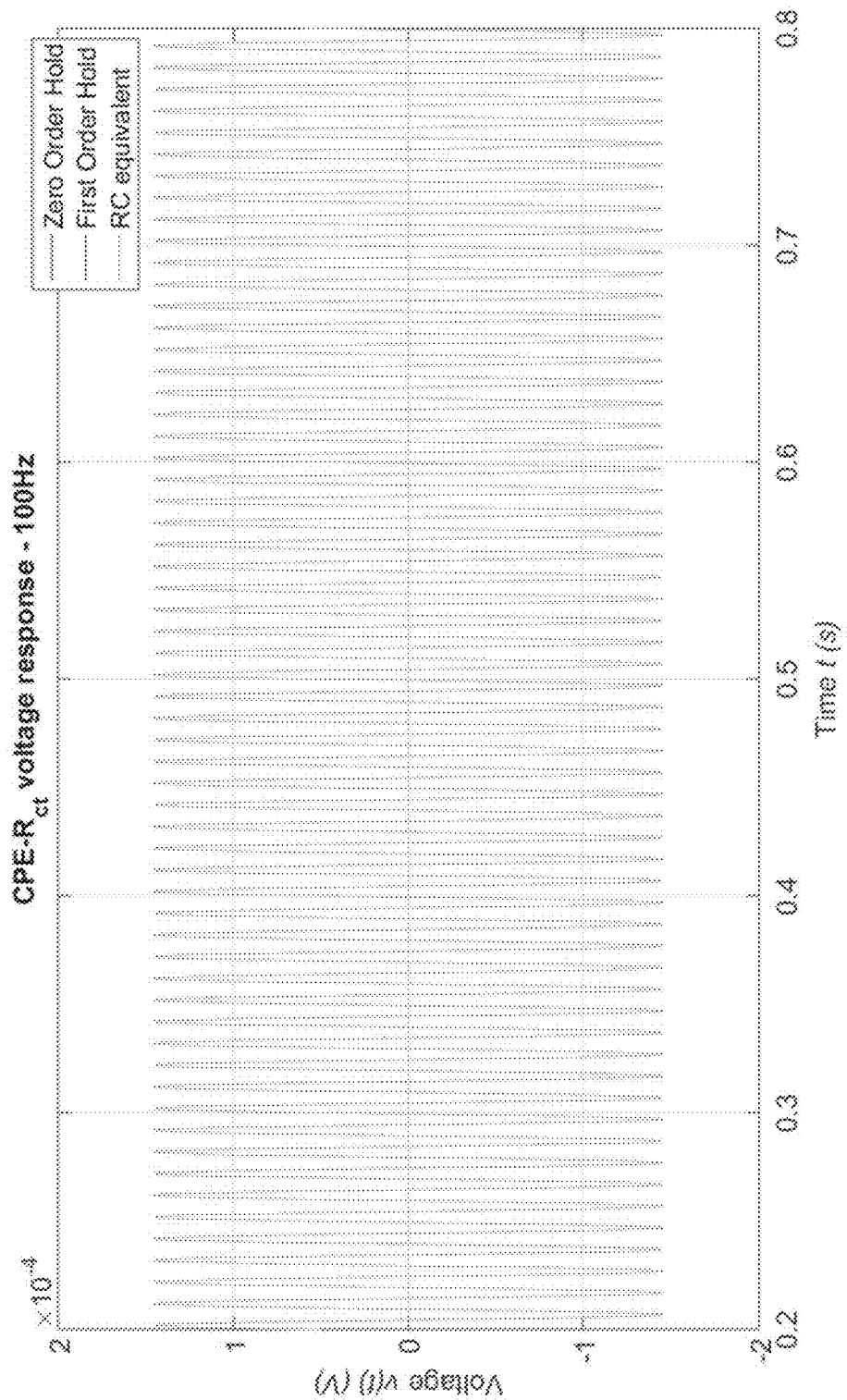
Figure 6C:
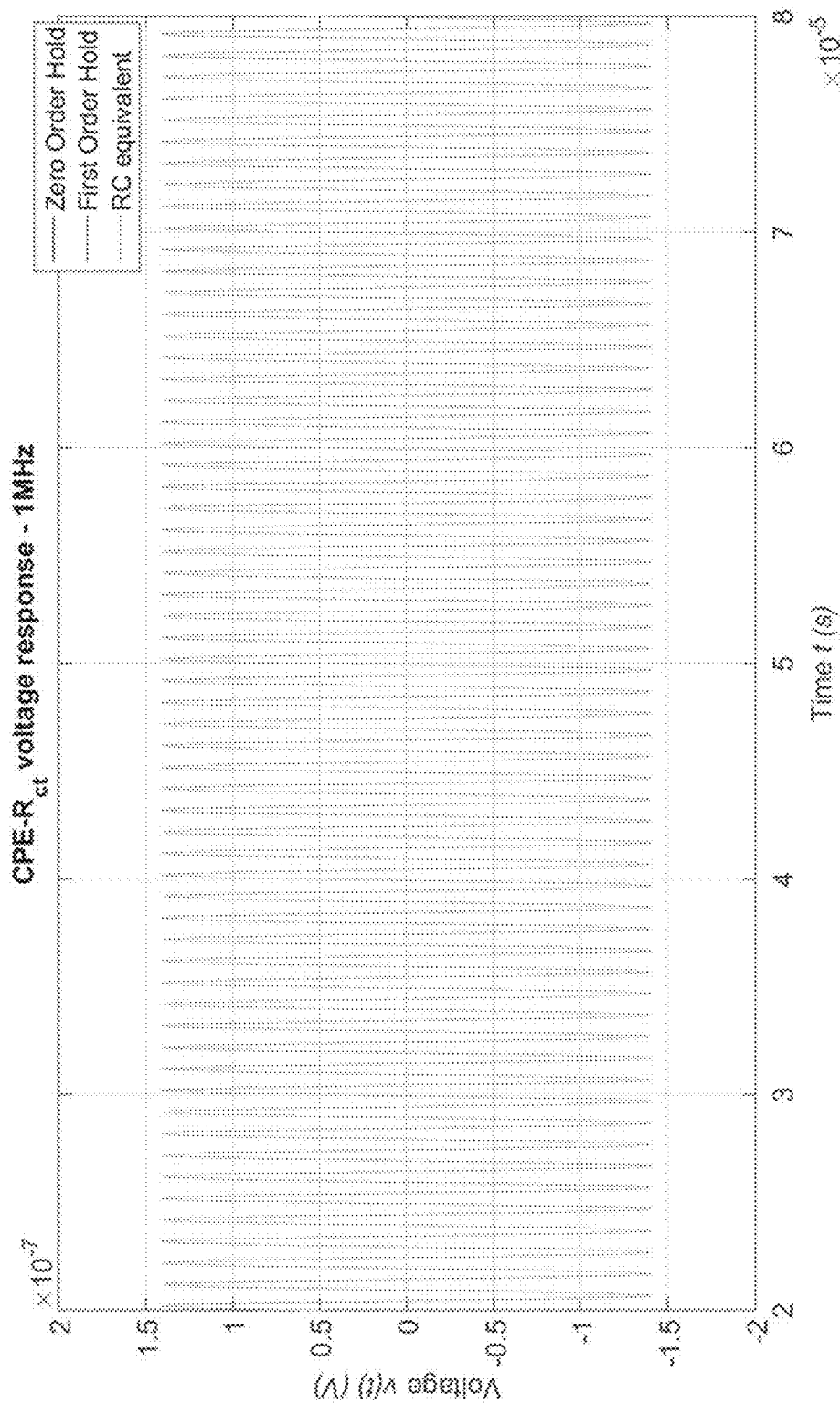

Table II shows the steady-state root-mean-square value of voltage v(t) and phase difference between v(t) and i(t) obtained by (29), (30), and equivalent $R_{eq}$–$C_{eq}$ model when the excitation frequency is 10 mHz. Table III shows the results when the excitation frequency is 100 Hz. Table IV shows the results when the excitation frequency is 1 MHz. The value of T in (29) and (30) is 27.78 μs. It can be observed from the results that the voltages obtained by the three methods are close. With reference to FIGS. 6A to 6C, there are shown simulation results with the three methods under three different frequencies.

TABLE II

With excitation frequency of 10 mHz

| Model | RMS Voltage (V) | Phase (deg) |
| --- | --- | --- |
| Equation (29) | 1.7225e−1 | 48.4517 |
| Equation (30) | 1.7225e−1 | 48.6992 |
| $R_{eq}$-$C_{eq}$ model | 1.7197e−1 | 48.5080 |

TABLE III

With excitation frequency of 100 Hz

| Model | RMS Voltage (V) | Phase (deg) |
| --- | --- | --- |
| Equation (29) | 2.0538e−4 | 68.0695 |
| Equation (30) | 2.0536e−4 | 67.8220 |
| $R_{eq}$-$C_{eq}$ model | 2.0536e−4 | 67.8188 |

TABLE IV

With excitation frequency of 1 MHz

| Model | RMS Voltage (V) | Phase (deg) |
| --- | --- | --- |
| Equation (29) | 1.9832e−7 | 68.0921 |
| Equation (30) | 1.9834e−7 | 67.8446 |
| $R_{eq}$-$C_{eq}$ model | 1.9832e−7 | 67.8414 |

These results obtained by equivalent $R_{eq}$–$C_{eq}$ model are taken as reference, and Table V shows the discrepancies of the results obtained by equations (29) and (30).

TABLE V

Discrepancies of the methods with equations (29) and (30)

| | Error of RMS Voltage (%) | | Error of Phase (%) | |
| --- | --- | --- | --- | --- |
| Frequency | With (29) | With (30) | With (29) | With (30) |
| 10 mHz | 1.6447e−1 | 1.6447e−1 | 3.9416e−1 | 1.1606e−1 |
| 100 Hz | 0 | 1.0330e−2 | 3.6966e−1 | 4.7185e−3 |
| 1 MHz | 3.5656e−3 | 1.4262e−2 | 3.6954e−1 | 4.7169e−3 |

The results as illustrated in the Figures and the above tables shows that the values obtained using these different methods are very close, therefore the plots of the values obtained by different methods substantially overlap with each other.

Figure 7:
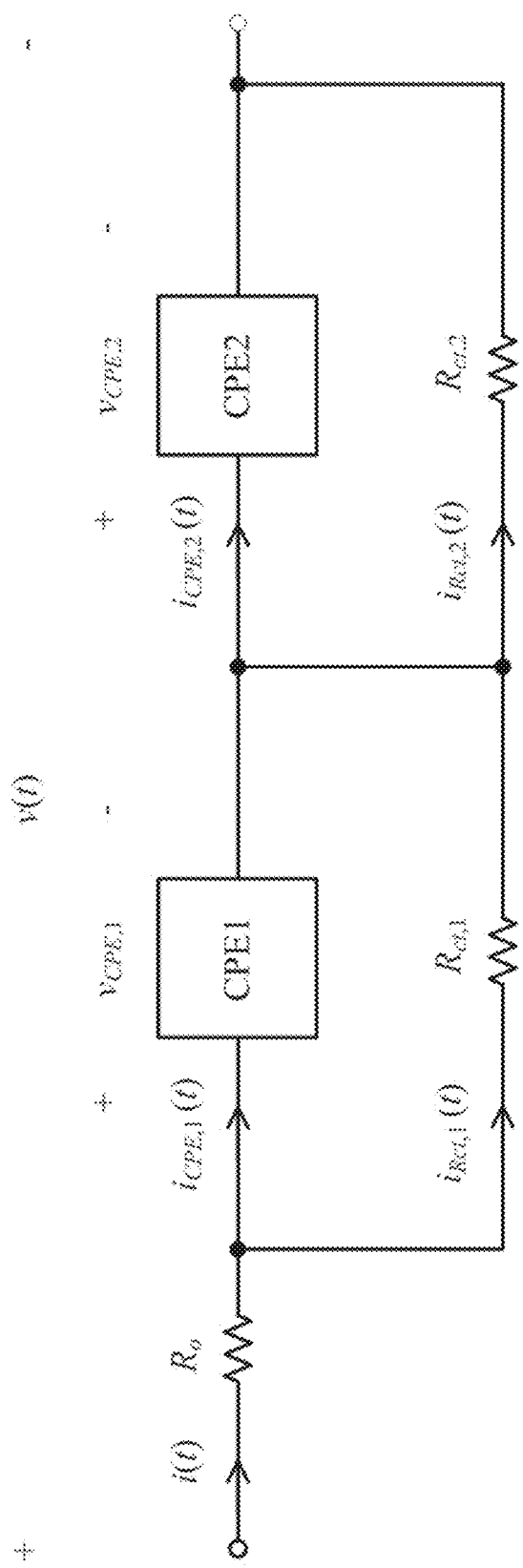
FIG. 7 is a schematic diagram of an example circuit including a Cole-Cole impedance network.
Figure 8A:
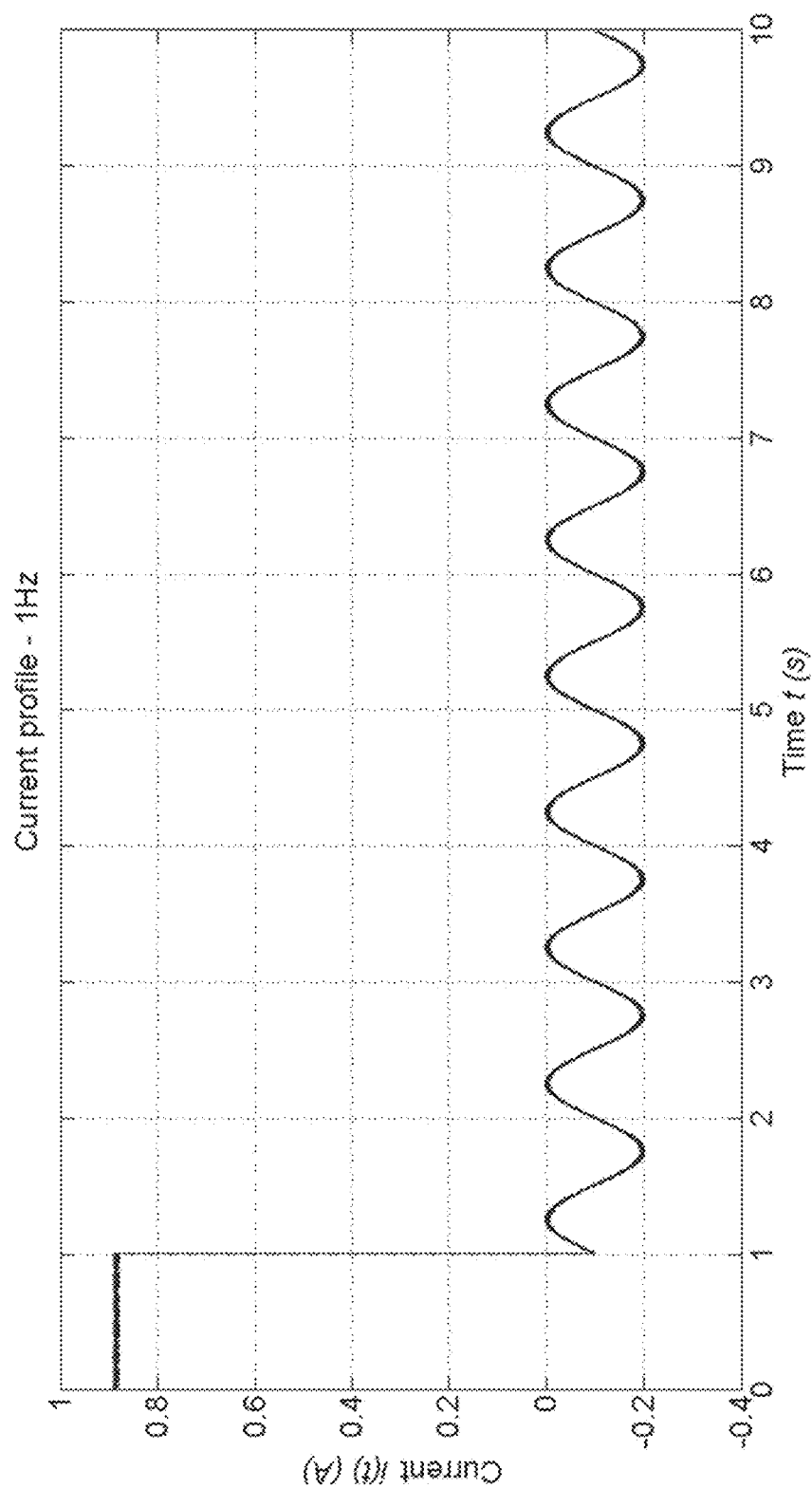
FIGS. 8A to 8D are plots showing sinusoidal current profiles under excitation frequency of 1 Hz, 10 Hz, 100 Hz and 1 kHz respectively.
Figure 8B:
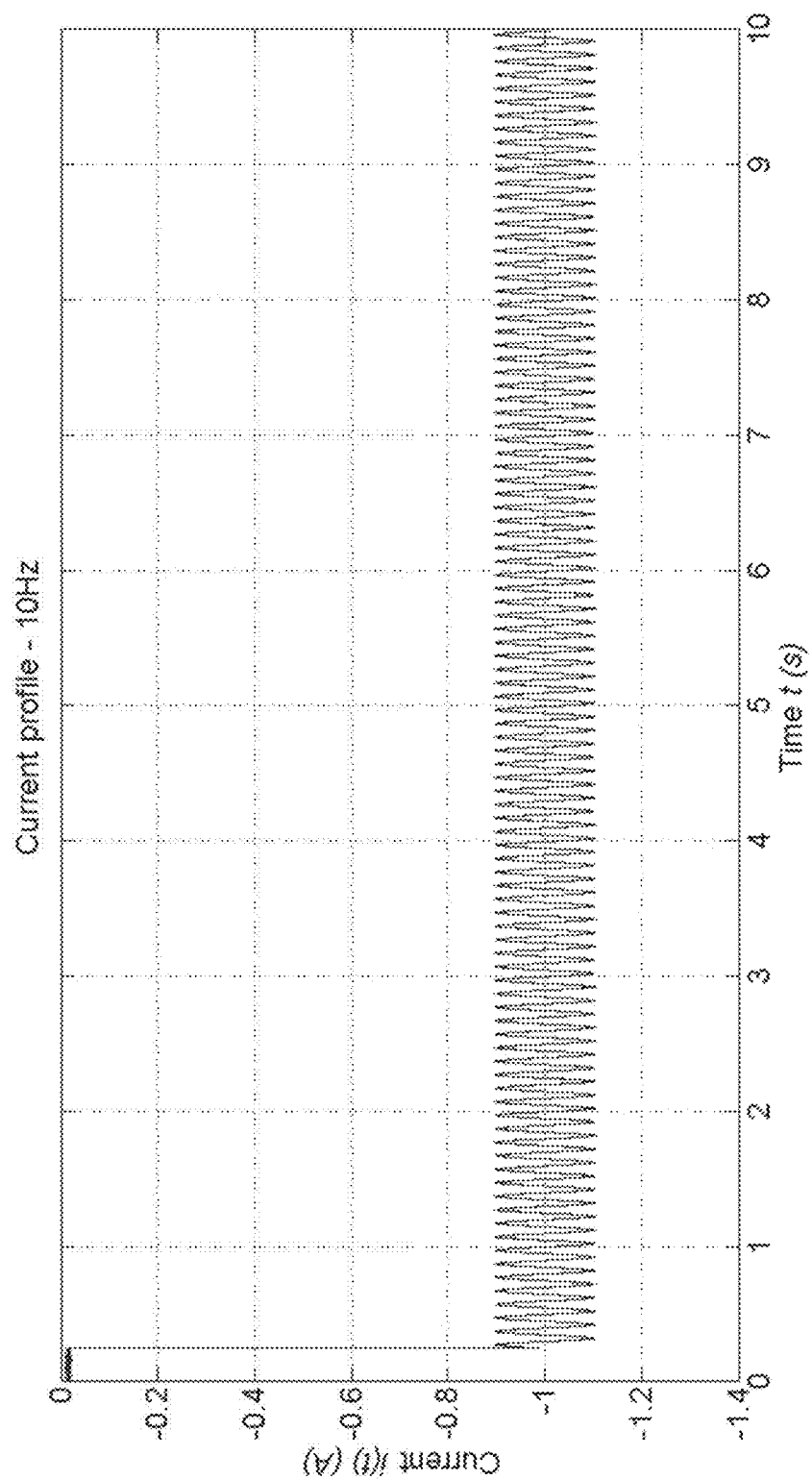
Figure 8C:
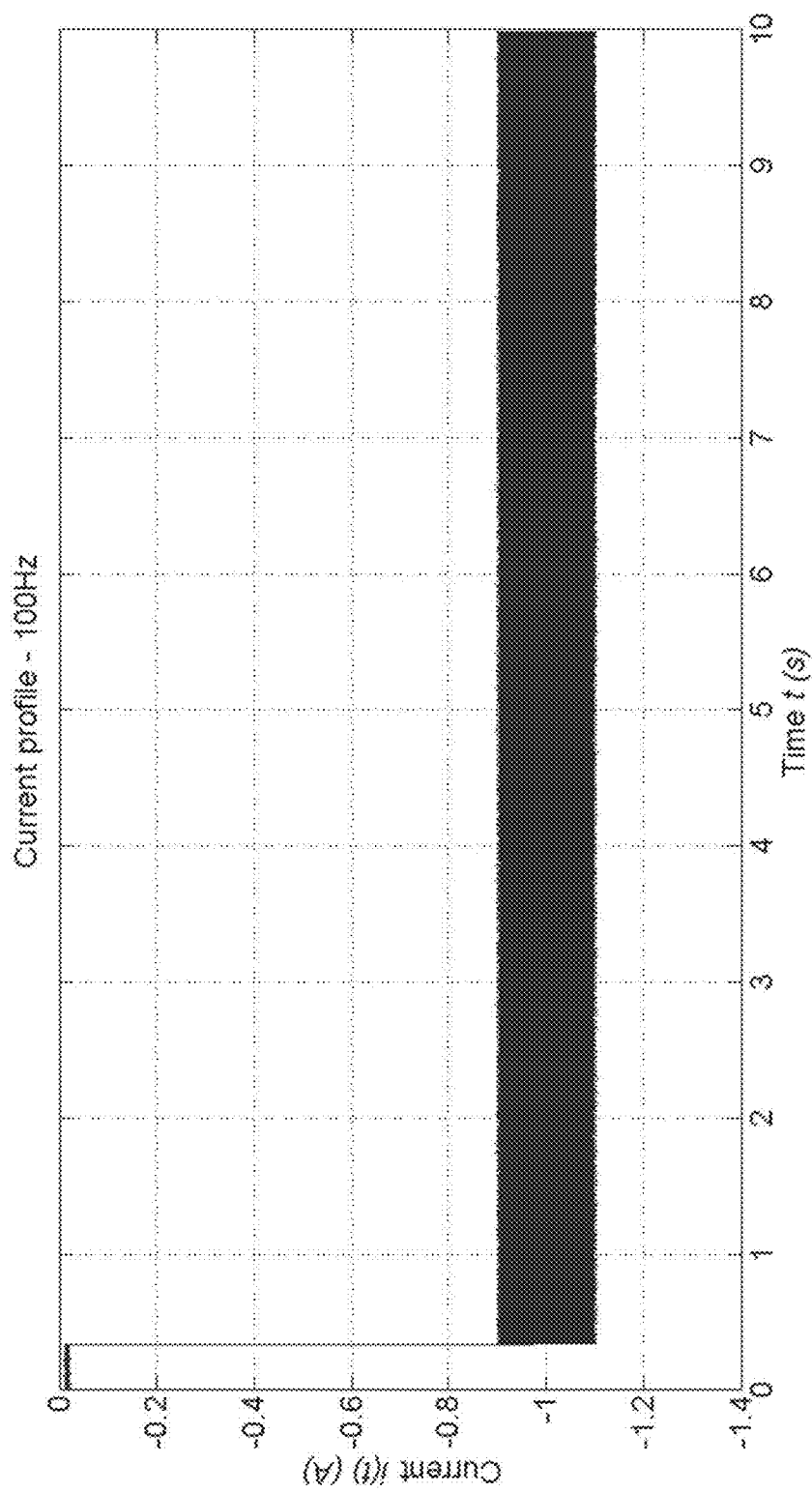
Figure 8D:
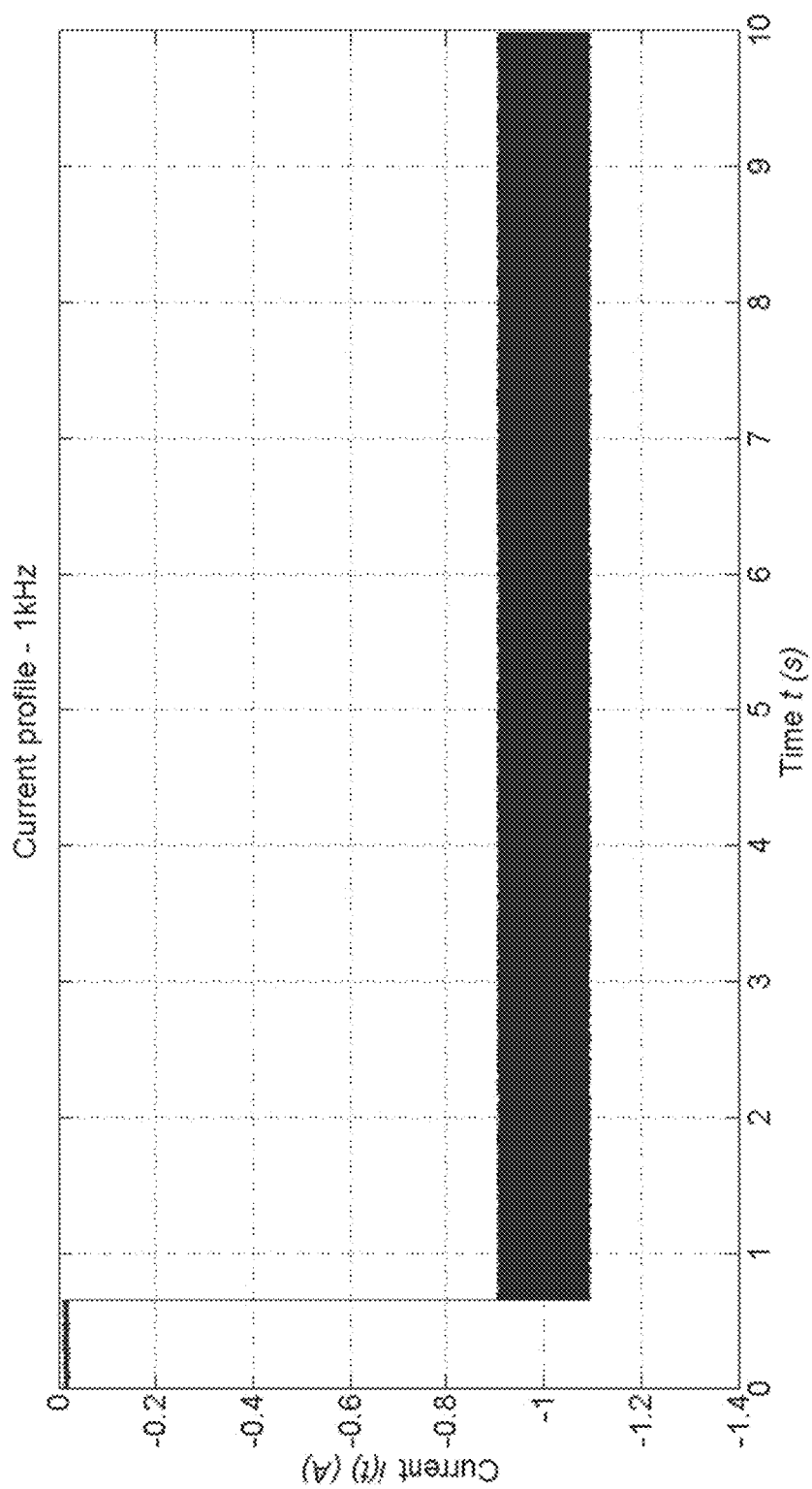
Figure 9A:
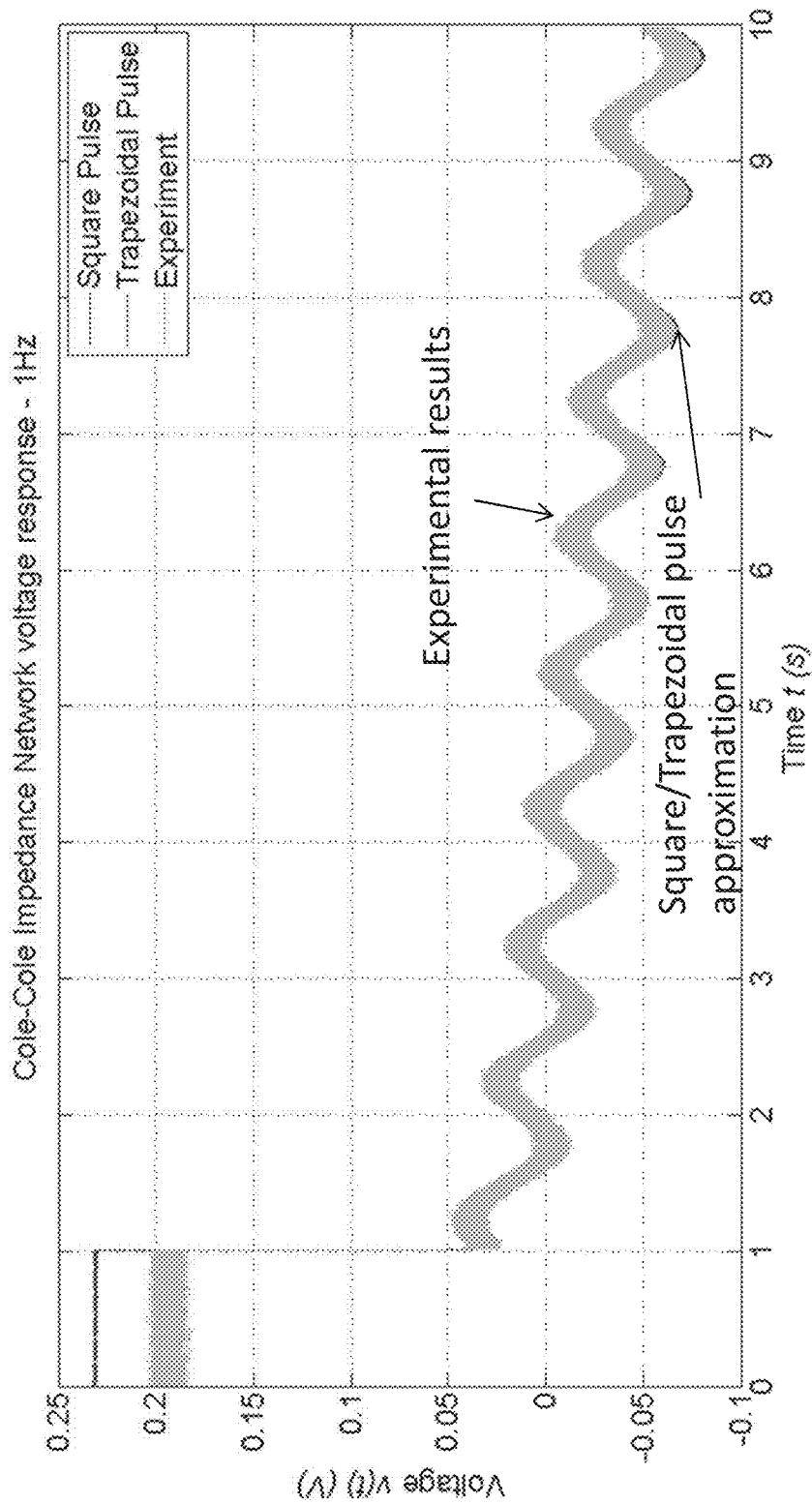
FIGS. 9A to 9D are plots showing time domain experimental results of a circuit with a battery in accordance with FIG. 7 and simulation results of using zero-order, first-order approximation of the example circuit of FIG. 7 under excitation frequency of 1 Hz, 10 Hz, 100 Hz and 1 kHz respectively.
Figure 9B:
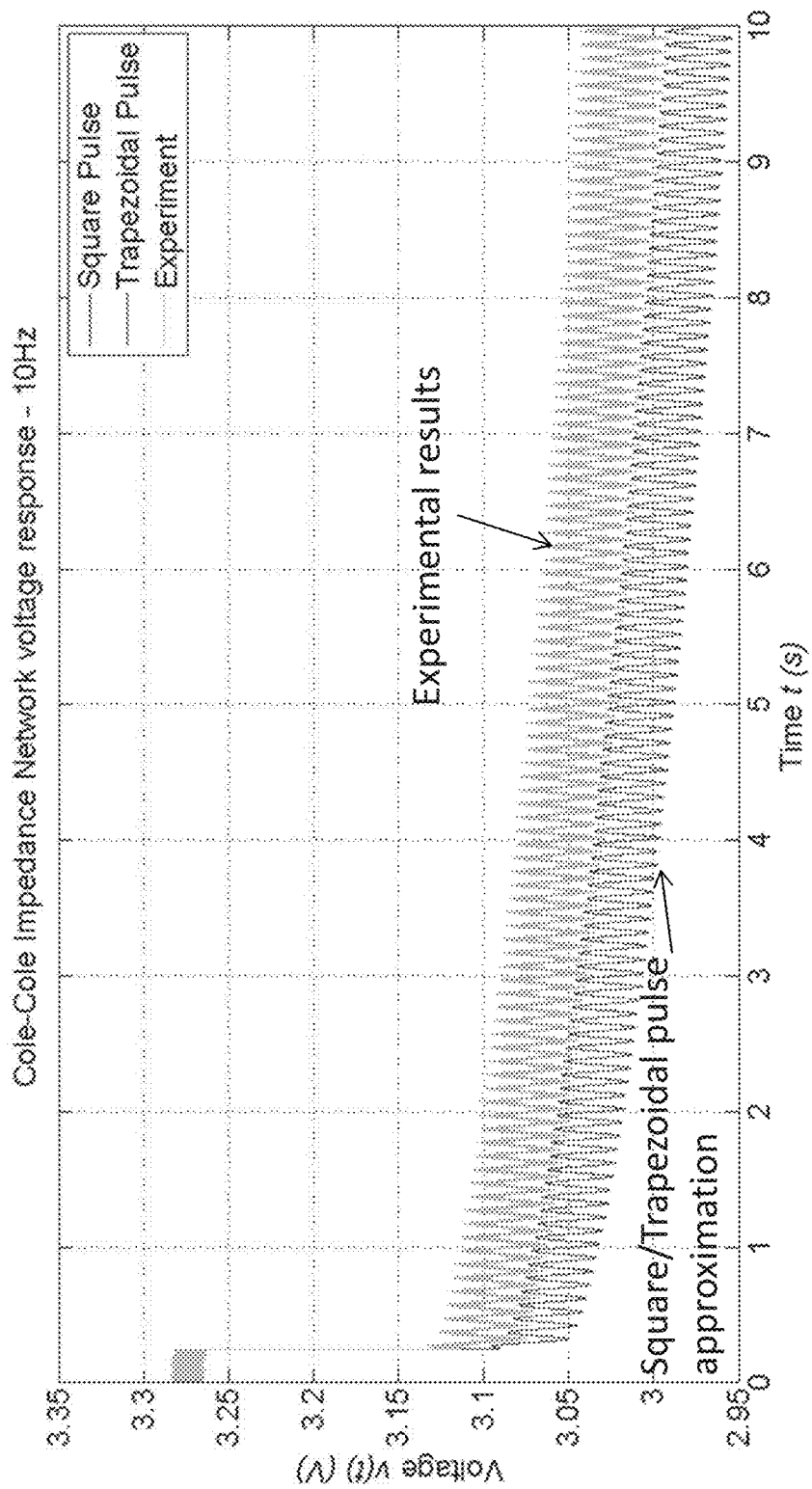
Figure 9C:
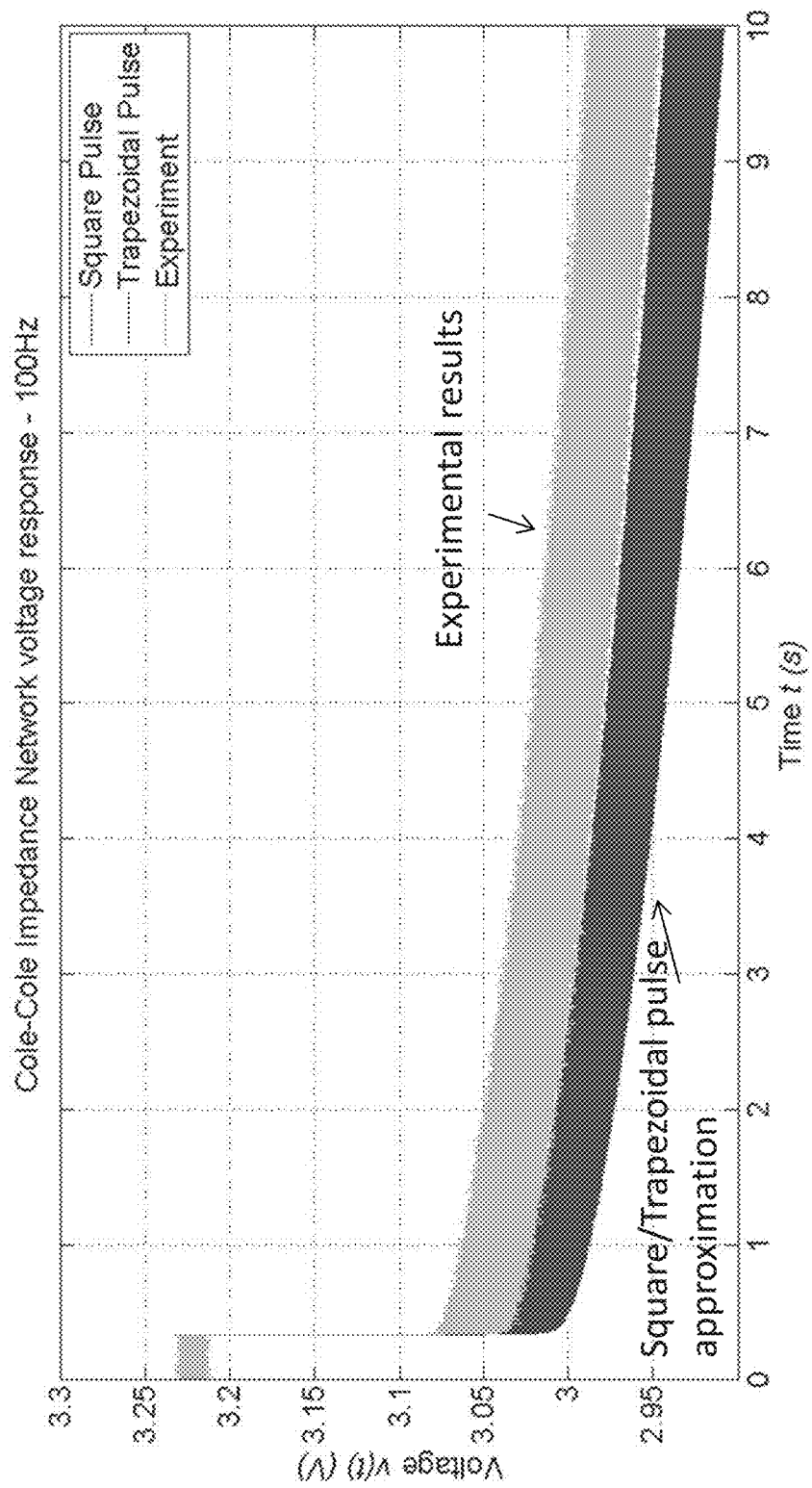
Figure 9D:
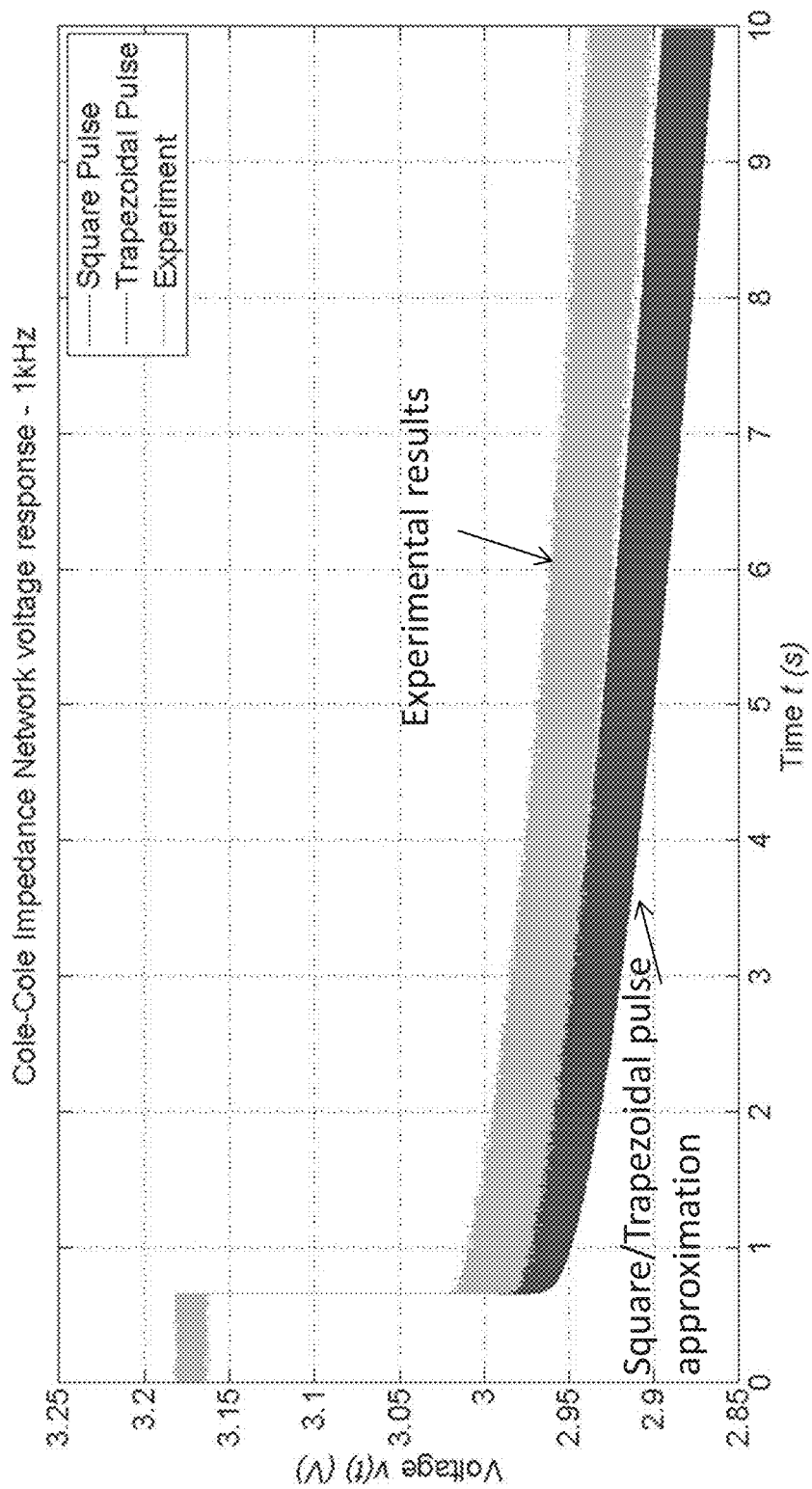

With reference to FIG. 7, there is shown an example Cole-Cole impedance network with two CPEs. It consists of an output resistor $R_o$, and two CPE-$R_{ct}$ circuits. Such network is popularly used to characterize the static and dynamic behaviors of batteries.

By using Kirchhoff's voltage and current laws, the voltage across the circuit v(t) and current through the circuit i(t) can be expressed as $$v(t) = i(t)R_o + v_{CPE,1}(t) + v_{CPE,2}(t) \quad (31)$$

$$i(t) = i_{CPE,1}(t) + i_{Rct,1}(t) \quad (32)$$

$$= i_{CPE,1}(t) + \frac{v_{CPE,1}(t)}{R_{ct,1}}$$

$$i(t) = i_{CPE,2}(t) + i_{Rct,2}(t) \quad (33)$$

$$= i_{CPE,2}(t) + \frac{v_{CPE,2}(t)}{R_{ct,2}}$$

Based on (32), $$i_{CPE,1}(t) = i(t) - \frac{v_{CPE,1}(t)}{R_{ct,1}} \quad (34)$$

Based on (33), $$i_{CPE,2}(t) = i(t) - \frac{v_{CPE,2}(t)}{R_{ct,2}} \quad (35)$$

By using (34), (35), and (18), $v_{CPE,1}(nT)$ and $v_{CPE,2}(nT)$ can be expressed as $$v_{CPE,1}(nT) = \frac{T^{\phi_1}}{\Gamma[\phi_1+1]C_{o,1}} \quad (36)$$
$$\sum_{k=0}^{n-1}\left\{i[kT] - \frac{v_{CPE,1}[kT]}{R_{ct,1}}\right\}[(n-k)^{\phi_1} - (n-k-1)^{\phi_1}] + V_{o,1}$$

$$v_{CPE,2}(nT) = \frac{T^{\phi_2}}{\Gamma[\phi_2+1]C_{o,2}} \quad (37)$$
$$\sum_{k=0}^{n-1}\left\{i[kT] - \frac{v_{CPE,2}[kT]}{R_{ct,2}}\right\}[(n-k)^{\phi_2} - (n-k-1)^{\phi_2}] + V_{o,2}$$

where $\phi_1$ and $\phi_2$ are the dispersion coefficient of CPE1 and CPE2, respectively, $C_{o,1}$ and $C_{o,2}$ are the double layer capacitance of CPE1 and CPE2, respectively, and $V_{o,1}$ and $V_{o,2}$ are the initial voltages across CPE1 and CPE2, respectively.

Equations (36) and (37) give the voltage-current characteristics of the two CPE-Rct circuits in FIG. 7 with the sampled current modeled by square pulses shown in FIG. 3A. The voltage-current characteristic of the impedance network is obtained by substituting (36) and (37) into (31).

By using (34), (35), and (25), $v_{CPE,1}(nT)$ and $v_{CPE,2}(nT)$ can be expressed as $$v_{CPE,1}(nT) = \frac{T^{\phi_1}}{C_{o,1}}\sum_{k=0}^{n-1}\left\{\frac{1}{\Gamma[\phi_1+1]}\left[\left\{i[kT] - \frac{v_{CPE,1}[kT]}{R_{ct,1}}\right\}(n-k)^{\phi_1} - \right.\right. \quad (38)$$
$$\left\{i[k+1T] - \frac{v_{CPE,1}[kT]}{R_{ct,1}}\right\}(n-k-1)^{\phi_1}\right] +$$
$$\left.\frac{i[k+1T] - i[kT]}{\Gamma[\phi_1+2]}[(n-k)^{\phi_1+1} - (n-k-1)^{\phi_1+1}]\right\} + V_{o,1}$$

$$v_{CPE,2}(nT) = \frac{T^{\phi_2}}{C_{o,2}}\sum_{k=0}^{n-1}\left\{\frac{1}{\Gamma[\phi_2+1]}\left[\left\{i[kT] - \frac{v_{CPE,2}[kT]}{R_{ct,2}}\right\}(n-k)^{\phi_2} - \right.\right. \quad (39)$$
$$\left\{i[k+1T] - \frac{v_{CPE,2}[kT]}{R_{ct,2}}\right\}(n-k-1)^{\phi_2}\right] +$$
$$\left.\frac{i[k+1T] - i[kT]}{\Gamma[\phi_2+2]}[(n-k)^{\phi_2+1} - (n-k-1)^{\phi_2+1}]\right\} + V_{o,2}$$

Equations (38) and (39) give the voltage-current characteristics of the two CPE-Rct circuits in FIG. 7 with the sampled current modeled by trapezoidal pulses shown in FIG. 3B. The voltage-current characteristic of the impedance network is obtained by substituting (38) and (39) into (31).

The voltage-current characteristics given in (38) and (39) are evaluated and compared with the experimental results. In this example, a Li-ion battery which has 130 mAH capacity has been used for the experimental verifications. Table VI shows the corresponding components value in Cole-Cole impedance network. Assume that the initial voltage $V_{o,1}$ and $V_{o,2}$ are zero. The experiments are conducted with sinusoidal and arbitrary profile.

For the sinusoidal current, the testing frequencies include 1 Hz, 10 Hz, 100 Hz, and 1 kHz with magnitude of 100 mA and a DC offset 1 A. FIGS. 8A to 8D show the current profiles under four different frequencies.

TABLE VI

Components values of Cole-Cole impedance network in evaluation

| $R_o$ | $\phi_1$ | $C_{o,1}$ | $R_{ct,1}$ | $\phi_2$ | $C_{o,2}$ | $R_{ct,2}$ |
|---|---|---|---|---|---|---|
| 0.1103 | 0.7538 | 53.54 | 0.3403 | 0.4114 | 0.4554 | 0.0990 |

Table VII shows the steady-state root-mean-square value of voltage v(t) and phase difference between v(t) and i(t) obtained by (38), (39), and experimental results when the excitation frequency is 1 Hz. Table VIII shows the results when the excitation frequency is 10 Hz. Table IX shows the results when the excitation frequency is 100 Hz. Table X shows the results when the excitation frequency is 1 kHz. The value of T in (38) and (39) is 10 ms. It can be observed from the results that the voltages obtained by the two methods are close to the experiments. FIGS. 9A to 9D show the simulation results with the two methods under four different frequencies.

TABLE VII

With excitation frequency of 1 Hz

| Model | RMS Voltage (V) | Phase (deg) |
|---|---|---|
| Equation (38) | 3.0389 | 26.1837 |
| Equation (39) | 3.0389 | 26.1837 |
| Experimental | 3.0780 | 28.1231 |

TABLE VIII

With excitation frequency of 10 Hz

| Model | RMS Voltage (V) | Phase (deg) |
|---|---|---|
| Equation (38) | 2.9894 | 157.3685 |
| Equation (39) | 2.9894 | 157.3697 |
| Experimental | 3.0312 | 158.0024 |

TABLE IX

With excitation frequency of 100 Hz

| Model | RMS Voltage (V) | Phase (deg) |
|---|---|---|
| Equation (38) | 2.9417 | 95.9637 |
| Equation (39) | 2.9417 | 95.9646 |
| Experimental | 2.9823 | 98.6328 |

TABLE X

With excitation frequency of 1 kHz

| Model | RMS Voltage (V) | Phase (deg) |
|---|---|---|
| Equation (38) | 2.8965 | 35.9279 |
| Equation (39) | 2.8965 | 35.9282 |
| Experimental | 2.9340 | 35.4900 |

If the results obtained by experiment are taken as reference, Table XI shows the discrepancies of the results obtained by equations (38) and (39).

TABLE XI

Discrepancies of the methods with equations (38) and (39)

| | Error of RMS Voltage (%) | | Error of Phase (%) | |
|---|---|---|---|---|
| Frequency | With (38) | With (39) | With (38) | With (39) |
| 1 Hz | −1.27031 | −1.27031 | −6.8961 | −6.8961 |
| 10 Hz | −1.37899 | −1.37899 | −0.4012 | −0.4004 |
| 100 Hz | −1.36137 | −1.36137 | −2.7061 | −2.7052 |
| 1 kHz | −1.27812 | −1.27812 | 1.23386 | 1.2347 |

The results as illustrated in the Figures and the above tables shows that the values obtained using square pulse approximation and the trapezoidal pulse approximation methods are very close, therefore the plots of the values obtained by these two methods substantially overlap with each other.

Figure 10:
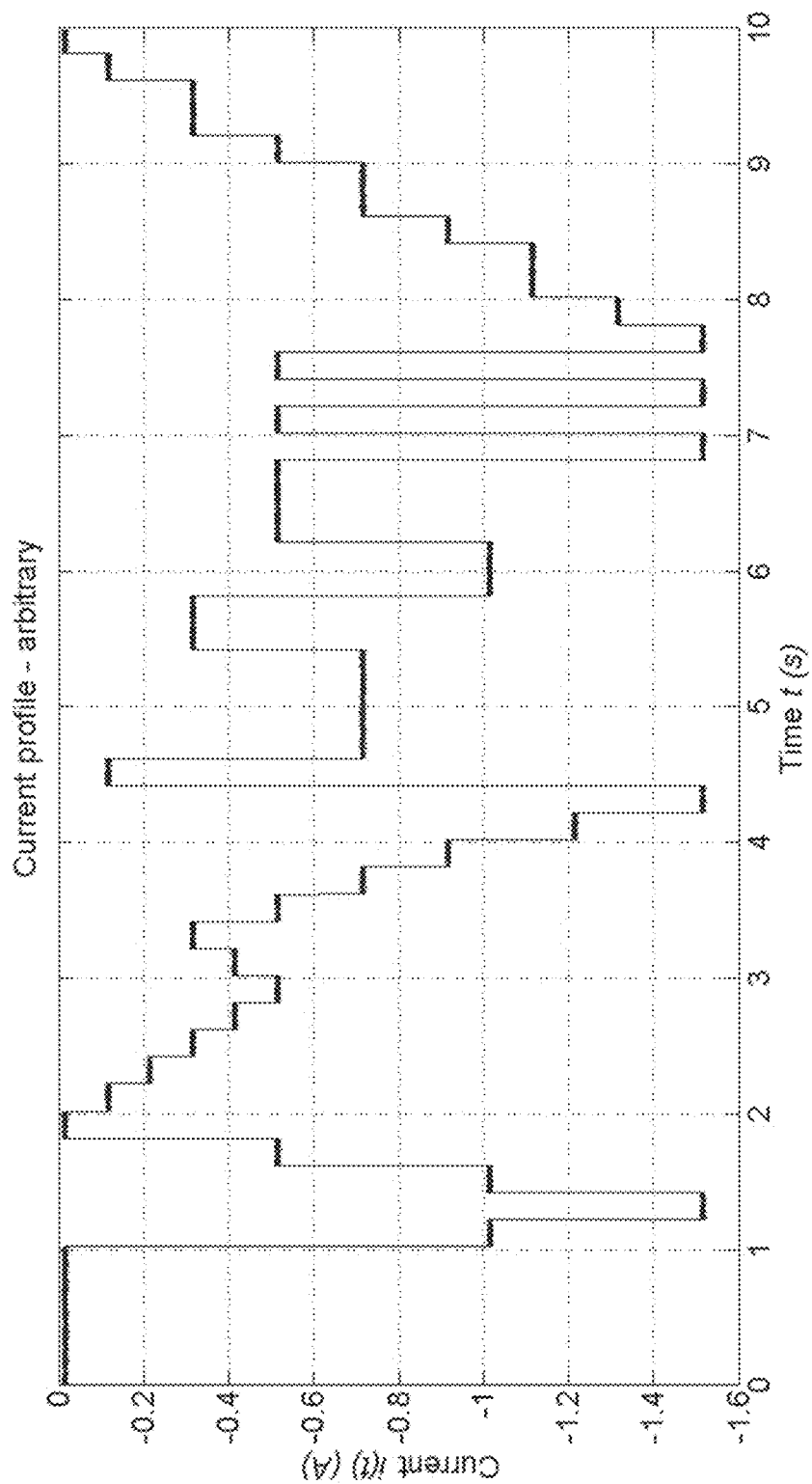
FIG. 10 is a plot showing an arbitrary current profile.
Figure 11:
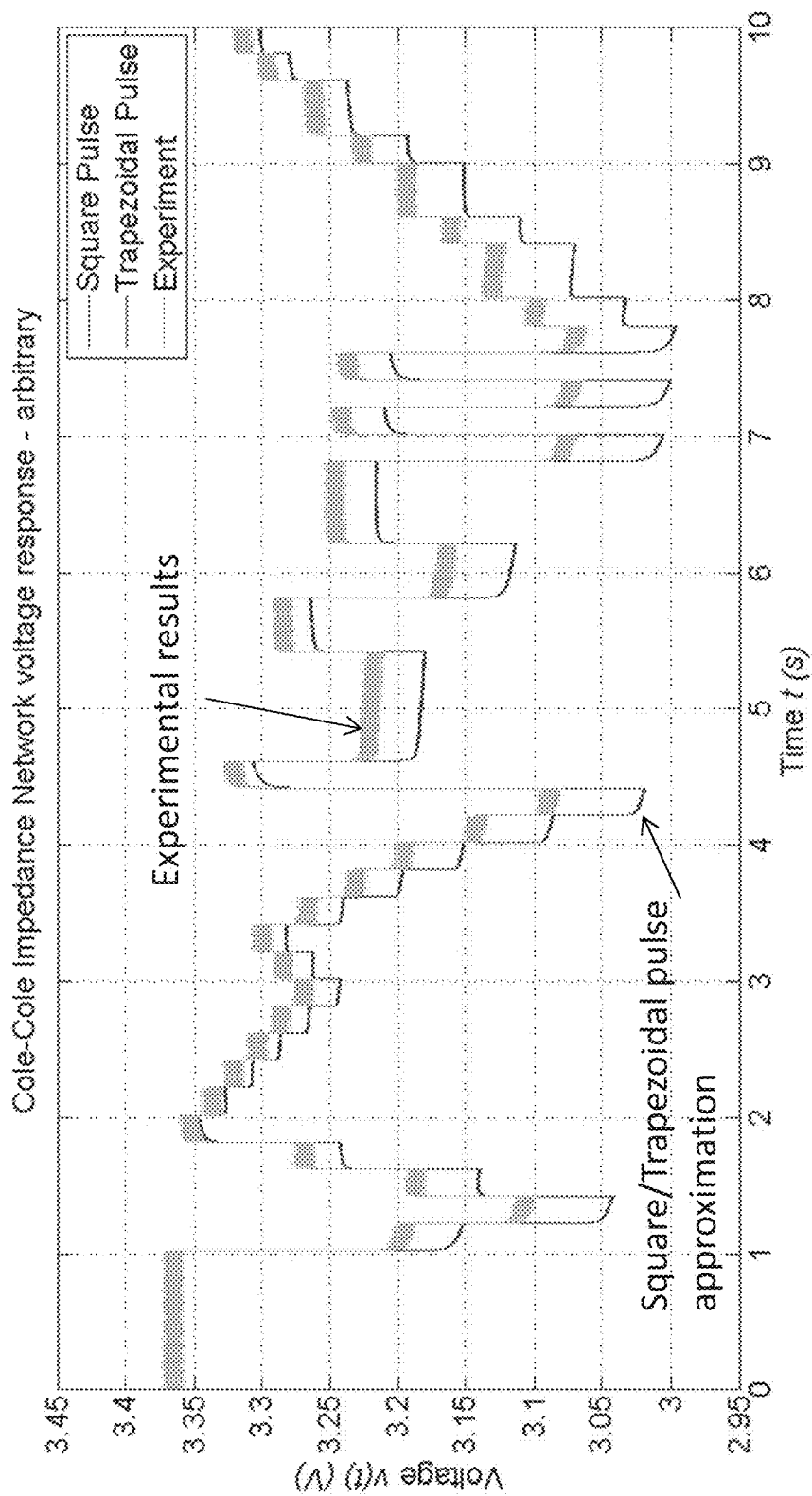
FIG. 11 is a plot showing time domain experimental results of a circuit with a battery in accordance with FIG. 7 and simulation results of using zero-order, first-order approximation of the example circuit of FIG. 7 under arbitrary current excitation of FIG. 10.

With reference to FIG. 10, there is shown the arbitrary current profile. Table XII shows the steady-state root-mean-square value of voltage v(t) and phase difference between v(t) and i(t) obtained by (38), (39), and experimental results with the arbitrary current profile. The value of T in (38) and (39) is 10 ms. It can be observed from the results that the voltages obtained by the two methods are close to the experiments. FIG. 11 shows the simulation results with the two methods under the arbitrary current profile excitation.

TABLE XII

With arbitrary current profile

| Model | RMS Voltage (V) | Phase (deg) |
|---|---|---|
| Equation (38) | 3.1617 | 45.1196 |
| Equation (39) | 3.1617 | 45.1189 |
| Experimental | 3.2018 | 45.2458 |

Figure 12:
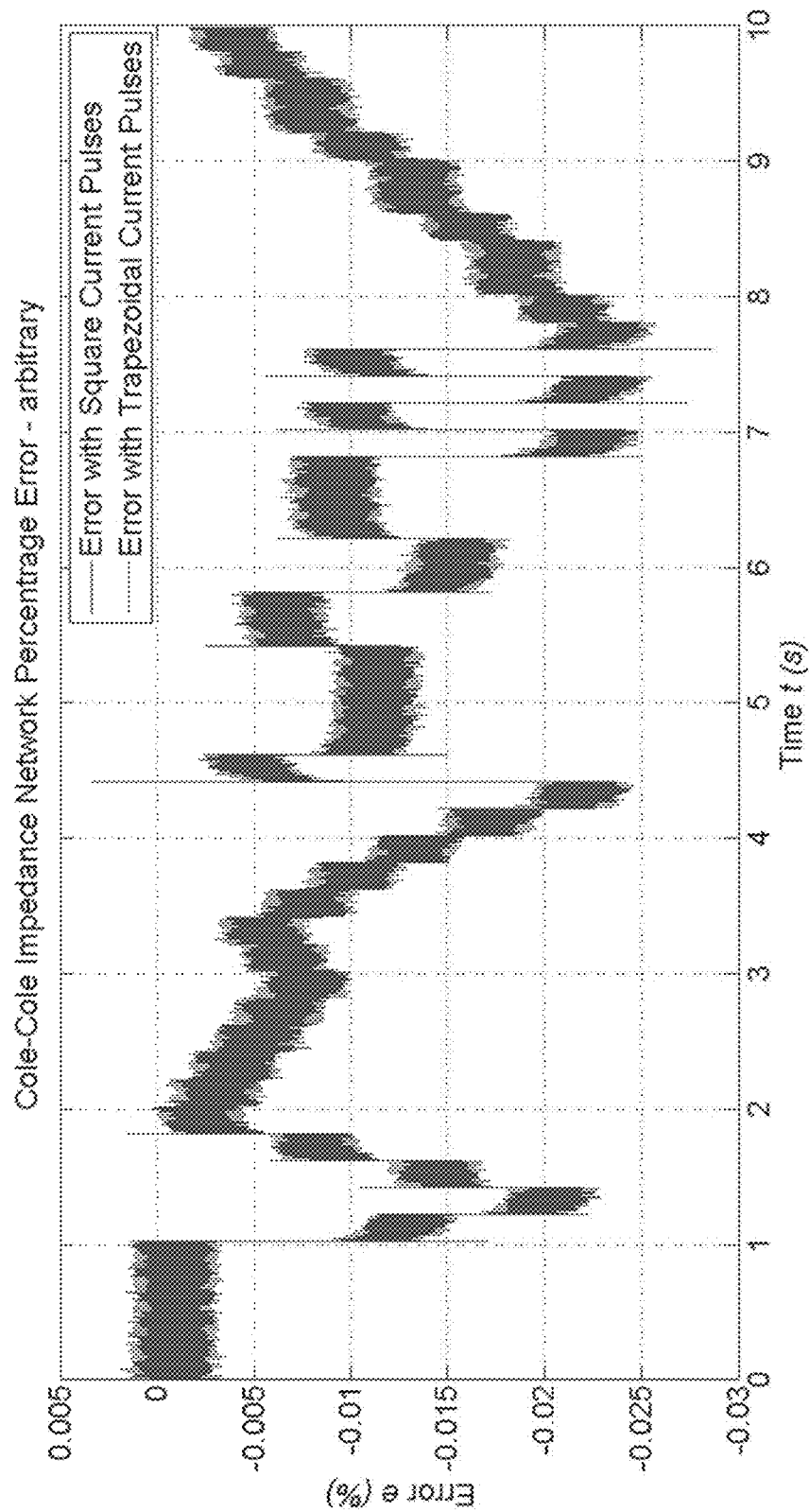
FIG. 12 is a plot showing a percentage error of the results in FIG. 11 between simulation results with the two methods and experiment circuit of FIG. 7.

If the results obtained by experiment are taken as reference, Table XIII shows the discrepancies of the results obtained by equations (38) and (39). FIG. 12 shows the percentage error between two methods and experiment.

TABLE XIII

Discrepancies of the methods with equations (38) and (39)

| Error of RMS Voltage (%) | | Error of Phase (%) | | Max Error (%) | |
|---|---|---|---|---|---|
| With (38) | With (39) | With (38) | With (39) | With (38) | With (39) |
| −1.25242 | −1.25242 | −0.2789 | −0.2789 | −0.0258 | −0.0287 |

Similar to the previous examples, the results as illustrated in the FIGS. 11 and 12 and the above tables shows that the values obtained using square pulse approximation and the trapezoidal pulse approximation methods are very close, therefore the plots of the values obtained by these two methods substantially overlap with each other.

These embodiments may be advantageous in that the method allows determining the time-domain response of the CPE to arbitrary excitation without dealing with the frequency response of the CPE. By applying zero- or first-order approximation to the waveforms, well-defined discrete-time functions for describing the relationships between the voltage and current of the CPE are derived.

Advantageously, the method and apparatus is generic and may be extended readily to estimate the time-domain voltage and current waveforms of electrical circuits with multiple CPEs and other circuit elements under arbitrary excitation. In addition, the method and apparatus may be applied in both simulated and real electric circuit.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

It will also be appreciated that where the methods and systems of the present invention may be either wholly implemented by computing system or partly implemented by computing systems then any appropriate computing system architecture may be utilised. This will include standalone computers, network computers and dedicated hardware devices. Where the terms "computing system" and "computing device" are used, these terms are intended to cover any appropriate arrangement of computer hardware capable of implementing the function described.

Any reference to prior art contained herein is not to be taken as an admission that the information is common general knowledge, unless otherwise indicated.

The invention claimed is:

1. A method for use in an electric circuit, comprising the steps of:
   obtaining an approximation of a voltage-current characteristic of at least one electrical circuit component of the electric circuit subjected to an excitation, wherein each of the at least one electrical circuit component is represented by a constant phase element in an equivalent circuit of the electric circuit; and
   estimating a time-domain voltage response and/or a time-domain current response based on the approximation of the voltage-current characteristic under the excitation applied to the electric circuit, wherein:
   the approximation includes a combination of a plurality of discrete-time representations, each representing the voltage-current characteristic at a predetermined time period, and a plurality of voltage responses of the at least one electrical circuit component in response to a plurality of current pulses;
   the approximation is a zero-order approximation or a first-order approximation, and, when the approximation is a zero-order approximation, the combination of a plurality of discrete-time representations is expressed as:

$$v_{CPE}(nT) = \frac{T^\phi}{\Gamma[\phi+1]C_o}\sum_{k=0}^{n-1} i_{CPE}[kT][(n-k)^\phi - (n-k-1)^\phi] + V_o,$$

and
when the approximation is a first-order approximation, the combination of the plurality of discrete-time representations is expressed as:

$$v_{CPE}(nT) = \frac{T^\phi}{C_o}\sum_{k=0}^{n-1}\left\{\frac{1}{\Gamma[\phi+1]}[i_{CPE}[kT](n-k)^\phi - i_{CPE}[k+1T](n-k-1)^\phi] + \frac{i_{CPE}[k+1T] - i_{CPE}[kT]}{\Gamma[\phi+2]}[(n-k)^{\phi+1} - (n-k-1)^{\phi+1}]\right\} + V_o,$$

wherein:
$\phi \in [0,1]$ represents a dispersion coefficient,
$C_o$ represents a capacitance value of the at least one electrical circuit component,
$\Gamma$ represents a Gamma function, and
$T$ represents the sampling period.

2. The method in accordance with claim 1, further comprising the step of decomposing a continuous current passing through the at least one electrical circuit component to the plurality of current pulses.

3. The method in accordance with claim 2, wherein each of the plurality of current pulses are represented by a linear relation.

4. The method in accordance with claim 1, wherein the current pulse includes a square waveform.

5. The method in accordance with claim 1, wherein the current pulse includes a trapezoidal waveform.

6. The method in accordance with claim 1, wherein the current pulse includes an initial current value and a final current value different from the initial current value.

7. The method in accordance with claim 1, wherein each of the at least one electrical circuit component is arranged to exhibit double-layer characteristics.

8. The method in accordance with claim 1, wherein each of the at least one electrical circuit component includes a battery or a supercapacitor.

9. An apparatus for use in an electric circuit, comprising:
   a sampling module arranged to obtain an approximation of a voltage-current characteristic of at least one electrical circuit component of the electric circuit subjected to an excitation, wherein each of the at least one electrical circuit component is represented by a constant phase element in an equivalent circuit of the electric circuit; and
   a processing module arranged to estimate a time-domain voltage response and/or a time-domain current response based on the approximation of the voltage-current characteristic under the excitation applied to the electric circuit, wherein:
   the approximation includes a combination of a plurality of discrete-time representations each representing the voltage-current characteristic at a predetermined time period, and a plurality of voltage responses of the at least one electrical circuit component in response to a plurality of current pulses;
   the approximation is a zero-order approximation or a first-order approximation;
   when the approximation is a zero-order approximation, the combination of a plurality of discrete-time representations is expressed as:

$$v_{CPE}(nT) = \frac{T^\phi}{\Gamma[\phi+1]C_o}\sum_{k=0}^{n-1} i_{CPE}[kT][(n-k)^\phi - (n-k-1)^\phi] + V_o,$$

or
when the approximation is a first-order approximation, the combination of the plurality of discrete-time representations is expressed as:

$$v_{CPE}(nT) = \frac{T^\phi}{C_o} \sum_{k=0}^{n-1} \left\{ \frac{1}{\Gamma[\phi+1]}[i_{CPE}[kT](n-k)^\phi - i_{CPE}[k+1T](n-k-1)^\phi] + \frac{i_{CPE}[k+1T] - i_{CPE}[kT]}{\Gamma[\phi+2]}[(n-k)^{\phi+1} - (n-k-1)^{\phi+1}] \right\} + V_o,$$

wherein:
$\phi \in [0,1]$ represents a dispersion coefficient,
$C_o$ represents a capacitance value of the at least one electrical circuit component,
$\Gamma$ represents a Gamma function, and
T represents the sampling period.

10. The apparatus in accordance with claim 9, wherein the sampling module is further arranged to sample a continuous current passing through the at least one electrical circuit component and to decompose the continuous current to the plurality of current pulses.

11. The apparatus in accordance with claim 10, wherein each of the plurality of current pulses are represented by a linear relation.

12. The apparatus in accordance with claim 9, wherein the current pulse includes a square waveform.

13. The apparatus in accordance with claim 9, wherein the current pulse includes a trapezoidal waveform.

14. The apparatus in accordance with claim 9, wherein the current pulse includes an initial current value and a final current value different from the initial current value.

15. The apparatus in accordance with claim 9, wherein each of the at least one electrical circuit component is arranged to exhibit double-layer characteristics.

16. The apparatus in accordance with claim 9, wherein each of the at least one electrical circuit component includes a battery or a supercapacitor.

* * * * *